(12) United States Patent
Pan et al.

(10) Patent No.: US 8,581,262 B2
(45) Date of Patent: Nov. 12, 2013

(54) ELECTRONIC DEVICES COMPRISING MULTI CYCLIC HYDROCARBONS

(75) Inventors: Junyou Pan, Frankfurt am Main (DE); Thomas Eberle, Landau (DE); Herwig Buchholz, Frankfurt (DE)

(73) Assignee: Merck Patent GmbH, Darmstadt (DE)

( * ) Notice: Subject to any disclaimer, the term of this patent is extended or adjusted under 35 U.S.C. 154(b) by 0 days.

(21) Appl. No.: 13/388,388

(22) PCT Filed: Jul. 7, 2010

(86) PCT No.: PCT/EP2010/004136
§ 371 (c)(1),
(2), (4) Date: Feb. 1, 2012

(87) PCT Pub. No.: WO2011/015265
PCT Pub. Date: Feb. 10, 2011

(65) Prior Publication Data
US 2012/0132898 A1    May 31, 2012

(30) Foreign Application Priority Data

Aug. 4, 2009 (EP) .................................... 09010037

(51) Int. Cl.
*H01L 51/30* (2006.01)
*H01L 21/04* (2006.01)

(52) U.S. Cl.
USPC   257/77; 257/40; 257/E51.026; 257/E51.051; 257/E21.041; 257/E51.025

(58) Field of Classification Search
USPC ................ 257/40, 77, E51.025, E51.026, 257/E51.051, E21.041
See application file for complete search history.

(56) References Cited

U.S. PATENT DOCUMENTS

| | | | |
|---|---|---|---|
| 2004/0109328 A1 | 6/2004 | Dahl et al. | |
| 2005/0019955 A1 | 1/2005 | Dahl et al. | |
| 2005/0074690 A1 | 4/2005 | Liu et al. | |
| 2005/0089890 A1* | 4/2005 | Cubicciotti | 435/6 |
| 2005/0168122 A1* | 8/2005 | Dahl et al. | 313/311 |
| 2005/0236977 A1 | 10/2005 | Yamada et al. | |
| 2006/0063107 A1* | 3/2006 | Liu et al. | 430/270.1 |
| 2007/0251446 A1* | 11/2007 | Dahl et al. | 117/104 |
| 2009/0075203 A1* | 3/2009 | Liu et al. | 430/285.1 |
| 2011/0082053 A1* | 4/2011 | Yang et al. | 506/15 |
| 2011/0112258 A1* | 5/2011 | Dahl et al. | 525/415 |

FOREIGN PATENT DOCUMENTS

| | | |
|---|---|---|
| CA | 2469858 A1 | 6/2003 |
| EP | 1453777 A1 | 9/2004 |
| EP | 1762553 A1 | 3/2007 |

* cited by examiner

*Primary Examiner* — Victor A Mandala
(74) *Attorney, Agent, or Firm* — Novak Druce Connolly Bove + Quigg LLP

(57) ABSTRACT

The present invention relates to compositions comprising functionalized or un-functionalized multi cyclic hydrocarbons and functional organic compounds, which can be used in different electronic devices. The invention further relates to an electronic device comprising one or more organic functional layers, wherein at least one of the layers comprises at least one functionalized or un-functionalized multi cyclic hydrocarbon. Another embodiment of the present invention relates to a formulation comprising functionalized or un-functionalized multi cyclic hydrocarbons, from which a thin layer comprising at least one functionalized or un-functionalized multi cyclic hydrocarbon can be formed.

25 Claims, 2 Drawing Sheets

ELECTRONIC DEVICES COMPRISING MULTI CYCLIC HYDROCARBONS

RELATED APPLICATIONS

Figure 1:
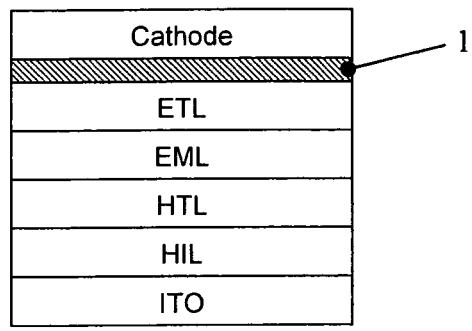

This application is a national stage application (under 35 U.S.C. §371) of PCT/EP2010/004136, filed Jul. 7, 2010, which claims benefit of European Application No. 09010037.1, filed Aug. 4, 2009.

The present invention relates to compositions comprising nano-diamondoids and functional organic compounds, which can be used in different electronic devices. The invention further relates to an electronic device, in particular light-emitting diodes, comprising one or more organic functional layers, wherein at least one of the layers comprises at least one nano-diamondoid compound. Another embodiment of the present invention relates to a formulation comprising nano-diamondoid compound(s), from which a thin layer comprising at least one nano-diamondoid compound can be formed.

Since two decades, organic light emitting diodes (OLED) have drawn tremendous attention due to their potential impact on display and lighting applications. OLEDs have several attractive features as compared to liquid crystal displays (LCD). They are characterized, for instance, by higher color richness, lower weight, wider view angles, higher contrast, and lower power consumption as compared to LCDs.

Significant advances were made in the research and development of OLEDs, both for evaporable small molecule based and soluble polymer based OLEDs. OLEDs, however, still suffer from short lifetimes. Moreover, the application of OLEDs requires a high driving voltage. In order to successfully compete with light emitting diodes (LED) in the general lighting market the power efficiency of OLEDs has to be reduced. Both aspects are closely related to each other. Reducing the driving voltage always leads to an increase in power efficiency, and usually to an improved lifetime. For display applications, it is also essential to keep the driving voltage as low as possible to keep the design and production of backplanes as easy as possible. So far several methods have been undertaken to reduce the driving voltage:

1) Kyuwook et al. (Appl. Phys. Lett. 2003, 83, 2949-2951) employed a combined cathode using fluoride and a metal, for example LiF. However, the shortcoming of such a cathode is, that it is not an universal cathode, i.e. it works only with selected materials. For example, both the LiF/Al cathode and the Ba/Al cathode for polymer light emitting diodes (PLEDs) do not work.
2) OLEDs with PIN structure developed by the company Novaled, where either a hole transport layer (HTL) or an electron transport layer (ETL) or both are electrically doped. A review is provided by Leo et al. in Chem. Rev. 2007, 107, 1233-1271. Using this technology, the driving voltage can be reduced. However, the dopants, both p- and n-dopants, are quite reactive, and very sensitive to oxygen. Therefore, it is difficult to ensure particularly reliability in mass production.
3) Light emitting electrochemical cells (LECs) as reported by Heeger et al. Science 1995, 269, 1086-1088 offer an alternative approach for low voltage devices, where an in-situ p-n junction is formed through the drift of the mobile ions from an electrolyte, which is blended with a light-emitting polymer. But the time for forming the p-n junction is rather long, which prevents LECs from being employed for display applications.

Therefore, there is still a need to provide alternative approaches in order to overcome the drawbacks of the prior art. The power efficiency of electro-optical devices have to be optimized by providing appropriate electrodes. In addition, the electrodes must be stable to allow the establishment of a cost effective and reliable production process.

The object of the present invention was thus to provide an alternative approach in order to reduce the driving voltage of OLEDs and other opto-electronic devices. Stability of the materials and reliability of production processes are also crucial elements of this approach and object of the present invention.

Recently, nano-diamondoids gained attention as reported by Schreiner et al. in Angew. Chem. Int. Ed. 2008, 47, 1022-1036. According to Schreiner et al. nano-diamondoids have a precisely defined chemical structure with high purity which is in contrast to nano-diamond powders. The authors define nano-diamond powders as mixtures of isomers or even mixtures of different compounds with broad size distributions. Nano-diamondoids, which can either be isolated from natural sources (e.g. oil, natural gas, or sediments) or chemically synthesized, have several interesting properties. They have, for instance, negative electron affinities, which is supposed to be responsible for functionalized tetramantane to be a monochromatic electron emitter (Science 2007, 316, 1460-1462). Nano-diamondoids haven been proposed to be applied as fingerprints for petroleum products such as gas condensates or gasoline, for pharmacological applications, or in the field of polymer chemistry.

Clay et al. (Nano Letters 2009, 9, 57-61) and Drummond (Nature Nanotechnology 2007, 2, 462-463) proposed the application of nano-diamondoids for field emission displays (FED). FED is also a flat panel display technology, but in contrast to OLEDs FEDs uses a large area electron source to provide electrons that move through a vacuum before striking colored phosphor in order to produce a color image.

Surprisingly, it has been found that the driving voltage of electric devices such as OLEDs can be reduced by employing nano-diamondoids.

The present invention, therefore, relates to a composition comprising at least one nano-diamondoid and at least one organic functional material.

The term organic functional material relates to any material comprising at least one organic or organometallic compound whose function goes beyond the function of an organic solvent. The functional compounds may preferably be selected from, e.g., photoactive compounds including emissive and absorbing compounds, magnetically active compounds, compounds enhancing penetration through barriers, stabilizing compounds, tensides, and preserving agents.

Particularly preferred functional compounds are selected, but not limited to, conductors, semiconductors, dyes, fluorescent compounds, phosphorescent compounds, photoabsorbing compounds, photosensing compounds, photo sensitizer and other photocactive compounds.

The organic functional material may additionally comprise a solvent, a mixture of solvents, or other organic or inorganic components which support or enable the function of the organic or organometallic compound.

The organic functional material may be selected from the group of small molecules, polymers, oligomers, or dendrimers, blends or mixtures thereof.

The term small molecule as used herein is defined as molecules being not a polymer, oligomer, dendrimer, or a blend. In particular, repeating structures are absent in small molecules. The molecular weight of small molecules is typically in the range of polymers with a low number of repeating units, oligomers or less.

The molecular weight of the small molecule is preferably below 5000 g/mol, particularly preferably below 4000 g/mol, and very particularly preferably below 3000 g/mol.

The polymers of the present invention preferably have 10 to 10000, particularly preferably 20 to 5000 and very particularly preferably 50 to 2000 repeat units. Oligomers according to this invention have preferably 2 to 9 repeat units. The branching index of the polymers and oligomers is between 0 (linear polymer without branching) and 1 (completely branched dendrimer). The term dendrimer as used herein is defined according to M. Fischer et al. in Angew. Chem., Int. Ed. 1999, 38, 885).

The molecular weight $M_W$ of the polymers of the present invention is preferably in the range of 10000 to 2000000 g/mol, particularly preferably in the range of 100000 to 1500000 g/mol, and very particularly preferably in the range of 200000 to 1000000 g/mol. The determination of $M_W$ can be performed according to standard techniques known to the person skilled in the art by employing gel permeation chromatography (GPC) with polystyrene as internal standard, for instance.

A blend is a mixture comprising at least one polymeric component. Preferred matrix materials for the blend are selected from, but not limited to, CBN (N,N-biscarbazoylbiphenyl), carbazoles (e.g. according to WO 05/039246, US 2005/0069729, JP 2004/288381, EP 1205527, and DE 102007002714), azacarbazoles (e.g. according to EP 1617710, EP 1617711, EP 1731584, and JP 2005/347160), ketones (e.g. according to WO 04/093207), phosphin oxides, sulfoxides, and sulfones (e.g. according to WO 05/003253), oligophenylenes, aromatic amines (e.g. according to US 2005/0069729), bipolar materials for matrices (e.g. according to WO 07/137,725), silanes (e.g. according to WO 05/111172), 9,9-diarylfluorene derivates (e.g. according to DE 102008017591), and azaboroles or boronic esters (e.g. according to WO 06/117052).

In a preferred embodiment of the present invention the composition comprises at least one nano-diamondoid which is hydrogen-terminated or functionalized. Any variation of the nano-diamondoid scaffold is considered to be a functionalization. Preferred functionalizations are substitutions of one or more carbon atoms of the nano-diamondoid scaffold with non-carbon atoms or with a group of atoms, introduction of double bonds into the nano-diamondoid scaffold, and substitution of at least one hydrogen atom.

Functionalization can occur at any position of the nano-diamondoid scaffold, preferred positions are atomic positions on the outer surface of the nano-diamondoid. Preferred positions for functionalizations are given in WO 2007/101535, WO 2007/065409, WO 2006/10362, and in Angew. Chem., Int. Ed. (08), 47, 1022-1036, for instance. In the case of adamantane preferred positions for functionalizations are the positions 1, 3, 5, and/or 7. In the case of diamantane preferred positions are 1, 4, 6, and/or 9. One of the preferred positions in tetramantane is, for example, position 6.

The nano-diamondoid can be functionalized in one or more positions of the carbon scaffold.

The term functionalization also includes non-covalent alterations of the nano-diamondoid, preferably by hydrophobic interactions, π-interactions, and van-der-Waals interactions which also includes forces between permanent dipole(s) and induced dipole(s) and forces between instantaneous induced dipole(s) and induced dipole(s) (London dispersion forces).

The term functionalization also includes non-covalent interactions between a functionalized nano-diamondoid an further atomic or molecular entities, preferably via hydrogen bonding, dipole-dipole interactions, ionic interactions, formation of molecular complexes, π-interactions, hydrophobic interactions, and van-der-Waals forces.

Nano-diamondoids may be preferably functionalized with linear or branched alkyl, alkenyl, or alkinyl groups, aromatic, cyclic, heterocyclic hydrocarbon groups, and formamides of hydrocarbons from the group of diamondoids as disclosed in WO 2007/101535.

Further preferred functionalized nano-diamondoids may be prepared according to WO 2007/065409 and include carboxylated, nitroxylated (—$ONO_2$) and/or methylated derivatives.

Preferred functionalized nano-diamondoids are further described in WO 2006/10362 and include, for instance, groups selected from —OH, —$O^-$, —SH, —$S^-$, substituted thiols, —SOH, —$SO_3H$, —NO, —$NO_2$, —CN, —NC, —$NH_2$, substituted amines, —CHO, —COOH, esters, —O(CHO), —$(CH_2)_n$—COOH, unsaturated fatty acids, aryls, and heteroaryls.

Functionalizations with —OH, —$O^-$, —SH, —$S^-$, substituted thiols, —$NO_2$, —CN, —NC, —$NH_2$, substituted amines, —CHO, —COOH, esters, —$(CH_2)_n$—COOH, unsaturated fatty acids, aryls, and heteroaryls are particularly preferred.

Functionalizations with —SH, —OH, —COOH, and —$NH_2$ are very particularly preferred.

Functionalized nano-diamondoids can, for example, be prepared as self-assembled layers as discussed by W. L. Yang et al. in Science 2007, 316, 1460-1462. Further examples for functionalization of nano-diamondoids can be found for examples in Gerzon Koert et al., J. Med. Chem. 1967, 10, 60-606, EP 0392059, and DE 102006009279.

A preferred composition of the present invention comprises at least one nano-diamondoid selected from, but not limited to, adamantane (Formula 1), diamantane (Formula 2), triamantane (Formula 3), tetramantane (Formulae 4 and 5), pentamantane (Formulae 6 and 7), cyclohexamantane (Formula 8), decamantane (Formula 9), higher diamondoids (e.g. Formulae 10 to 56), and isomers and analogues thereof.

Formula 1

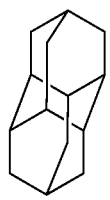

Formula 2

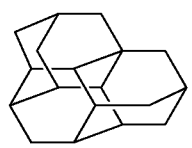

Formula 3

Formula 4
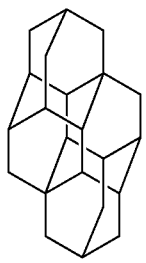
Formula 5
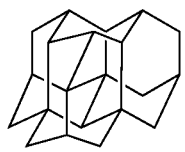
Formula 6
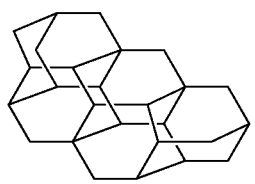
Formula 7
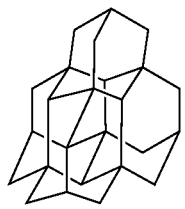
Formula 8
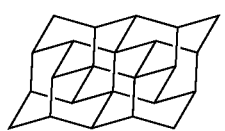
Formula 9
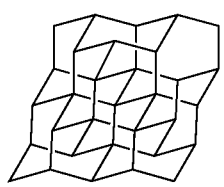
Formula 10
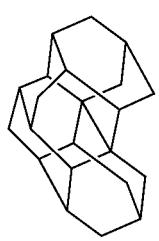
Formula 11
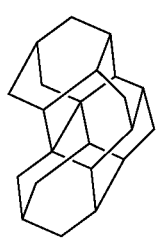
Formula 12
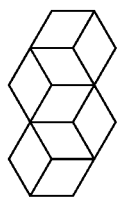
Formula 13
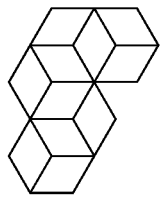
Formula 14
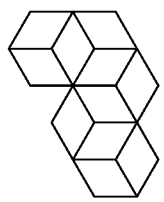
Formula 15
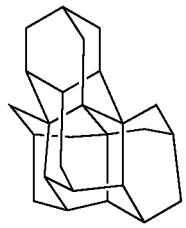
Formula 16
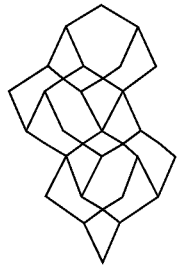
Formula 17
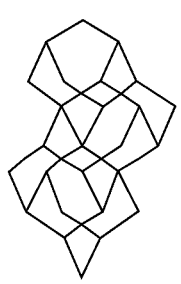
Formula 18
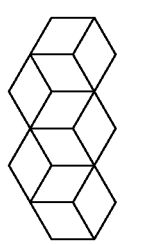

-continued
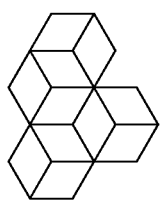
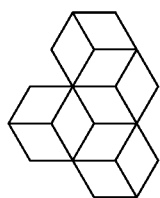
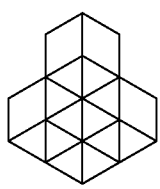
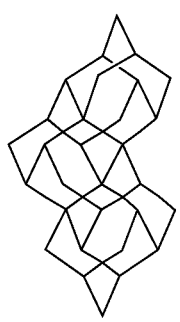
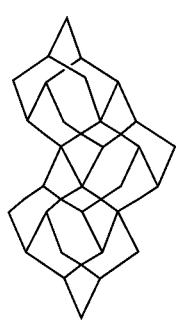
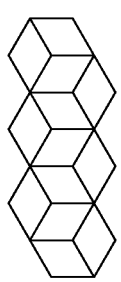
-continued
Formula 19
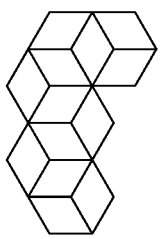
Formula 20
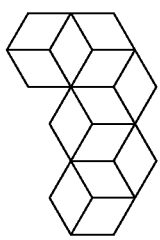
Formula 21
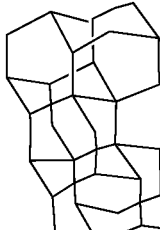
Formula 22
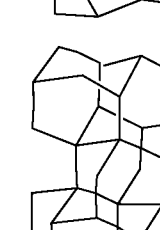
Formula 23
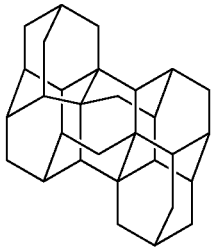
Formula 24
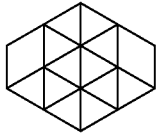
Formula 25
Formula 26
Formula 27
Formula 28
Formula 29
Formula 30
Formula 31
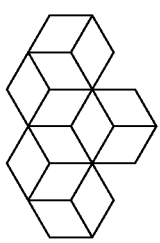

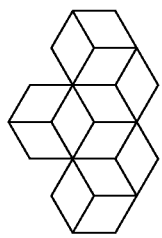
Formula 32
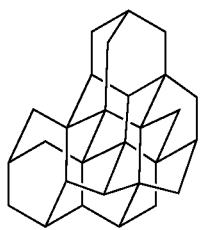
Formula 33
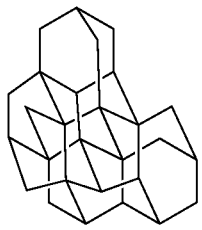
Formula 34
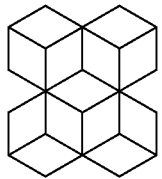
Formula 35
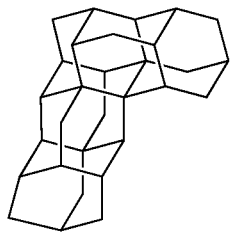
Formula 36
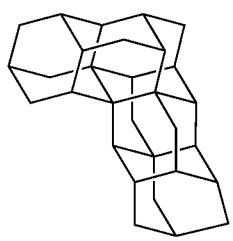
Formula 37
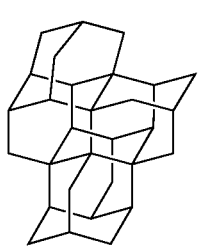
Formula 38
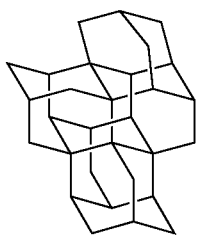
Formula 39
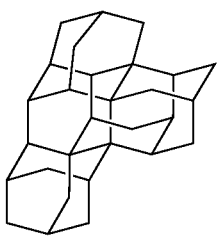
Formula 40
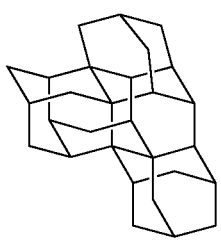
Formula 41
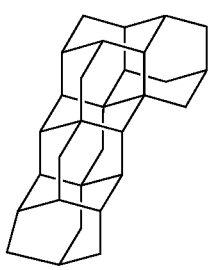
Formula 42
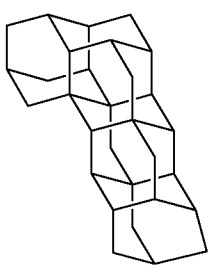
Formula 43
Formula 44

Formula 45
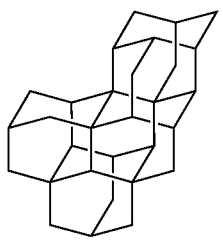

Formula 46
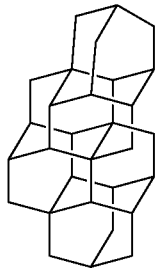

Formula 47
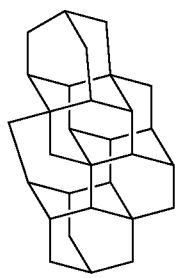

Formula 48
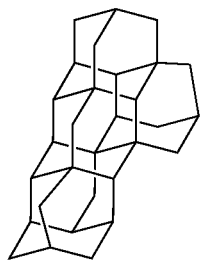

Formula 49
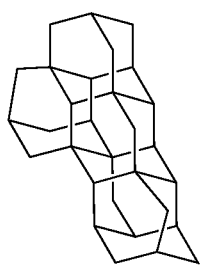

Formula 50
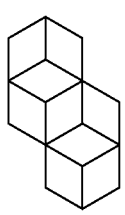

Formula 51
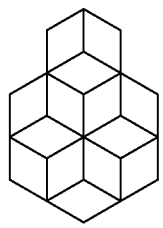

Formula 52
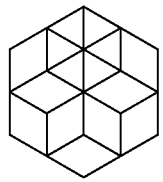

Formula 53
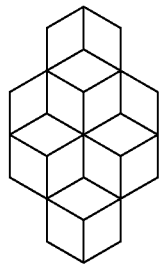

Formula 54
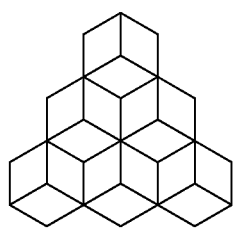

Formula 55
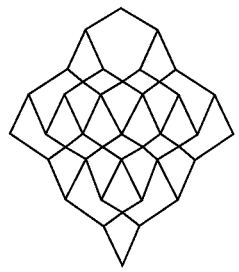

Formula 56
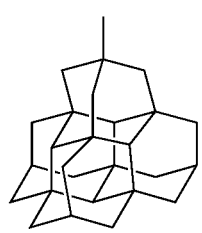

The isomers of the present invention may show any kind of isomerism, including configurational isomerism, constitutional isomerism, degenerate rearrangement, enantiomerism, in-out isomerism, stereoisomerism, or tautomerism. In addition, polymorphic structures are also considered to belong to the class of isomers. Polymorphic structures include different crystalline and amorphous structures of a molecular entity as well as hydrates and solvates.

A particularly preferred composition of the present invention comprises at least one nano-diamondoid selected from, but not limited to, adamantane (Formula 1), diamantane (Formula 2), triamantane (Formula 3), tetramantane (Formulae 4 and 5), pentamantane (Formulae 6 and 7), cyclohexamantane (Formula 8), and decamantane (Formula 9).

The nano-diamondoids may be functionalized in any position with any radical $(R)_n$, wherein n is preferably 0, 1, 2, 3, 4, 5, 6, 7, 8, 9, or 10, particularly preferably n is 0, 1, 2, 3, 4, or 5, very particularly n is 0 or 1.

In a preferred embodiment the nano-diamondoids functionalized with $(R)_n$, have the scaffold with the Formulae 1 to 56.

The compositions comprise at least one nano-diamondoid in a concentration of 10 to 90 wt %, preferably 20 to 80 wt %, particularly preferably 20 to 50 wt %, and very particularly preferably 20 to 40 wt %.

The composition of the present invention can further comprise, in addition to at least one nano-diamondoid, at least one organic functional material which is selected from host materials, emissive materials (EM), hole injection materials (HIM), hole transport materials (HTM), hole blocking materials (HBM), electron injection materials (EIM), electron transport materials (ETM), electron blocking materials (EBM), exciton blocking materials (ExBM), photoabsorption materials, dyes, and metal complexes.

The compositions of the present invention comprise 1 to 90 wt %, preferably 20 to 80 wt %, particularly preferably 50 to 80 wt %, and very particularly preferably 60 to 80 wt % of the host material, polymeric emissive material, HIM, HTM, HBM, EIM, ETM, EBM, ExBM, and photoabsorption material.

In a preferred embodiment, the said composition comprises two organic functional materials, wherein the first organic functional material is selected from low molecular weight emissive materials, dye, metal complex as phosphorescent emitter, and the second organic functional material is preferably selected from host materials. The said first organic functional material has a concentration of 0.1 to 30 wt %, preferably 1 to 25 wt %, particularly preferably 2 to 20 wt %, and very particularly preferably 5 to 15 wt %.

For organic functional materials or organic semiconductors, important characteristics are the binding energies, which are measured with respect to the vacuum level of the electronic energy levels, particularly the highest occupied molecular orbital (HOMO), and lowest unoccupied molecular orbital (LUMO) levels. These orbital levels may be measured by photoemission, e.g. X-ray photoelectron spectroscopy (XPS) and Ultra-violet photoelectron spectroscopy (UPS) or by cyclovoltammetry (CV) for oxidation and reduction, for instance. It is well understood in the field that the absolute energy levels are dependent of the method used, and even if the evaluation method for the same method, for example the onset point and peak point on the CV curved results in different values. Therefore, a reasonable comparison should be made by the same evaluation method of the same measurement method. More recently, quantum chemical calculations, for example Density Functional Theory (DFT), have become well-established methods to calculate the molecular orbitals, particularly occupied molecular orbitals.

Singlet levels can be measured by UV/VIS spectroscopy and/or fluorescence spectroscopy. Triplet levels can be measured by photoluminescence spectroscopy at low temperatures. Furthermore, singlet and triplet levels can also be calculated by time-dependent DFT.

The composition of the present invention can also comprise at least one emissive material as organic functional material.

In a preferred embodiment, the composition of the present invention is characterized in that the emissive material comprises at least one host material and at least one emitter material, wherein the host material is selected from anthracenes, benzanthracenes, ketones, carbazoles, triarylamines, indenofluorenes, fluorenes, spirobifluorenes, phenanthrenes, dihydrophenanthrenes, thiophenes, triazines, isomers and derivatives thereof.

In a particularly preferred embodiment, the composition of the present invention is characterized in that the emissive material comprises at least one host material and at least one emitter material, wherein the host material is selected from anthracenes, benzanthracenes, ketones, carbazoles, triarylamines, indenofluorenes, fluorenes, spirobifluorenes, phenanthrenes, dihydrophenanthrenes, thiophenes, and triazines.

In another preferred embodiment of this invention the emissive material comprises at least one host material and at least one emitter material.

In another embodiment of the present invention the emissive material wherein the host material is selected from anthracenes, benzanthracenes, ketones, carbazoles, triarylamines, indenofluorenes, fluorenes, spirobifluorenes, phenanthrenes, dihydrophenanthrenes, thiophenes, triazines, isomers and derivatives thereof.

Emissive materials can also be selected from metal complexes as described below.

Particularly preferred is an emissive material comprising two host materials and very particularly preferably the emissive material comprises one host material.

Particularly preferred is an emissive material comprising two emitter materials and very particularly preferably the emissive material comprises one emitter material.

The term emitter refers to a material or unit which, upon receiving excitonic energy by energy transfers from other units, or by forming an exciton either electrically or optically, undergoes radiative decay to emit light.

Host materials have, in general, larger energy gaps between the highest occupied molecular orbital (HOMO) and the lowest unoccupied molecular orbital (LUMO) as compared to emitter materials. In addition, host materials behave either as electron or hole transport material. Host materials can also have both electron and hole transport properties. In case singlet transitions are predominantly responsible for photoluminescence in OLEDs, an maximal overlap between the absorption spectrum of the emitter with the photoluminescence spectrum of the host material is highly desirably. This ensures the energy transfer from the host material to the emitter.

Suitable host materials for this purpose are materials from various classes of substances. Preferred host materials are selected from the classes of the oligoarylenes (for example 2,2',7,7'-tetraphenylspirobifluorene in accordance with EP 676461 or dinaphthylanthracene), in particular the oligoarylenes containing condensed aromatic groups, such as, for example, phenanthrene, tetracene, coronene, chrysene, fluorene, spirofluorene, perylene, phthaloperylene, naphthaloperylene, decacyclene, rubrene, the oligoarylenevinylenes (for example 4,4'-bis(2,2-diphenylethenyl)-1,1'-biphenyl (DPVBi) or 4,4-bis-2,2-diphenylvinyl-1,1-spirobiphenyl (spiro-DPVBi) in accordance with EP 676461), the polypodal metal complexes (for example in accordance with WO 04/081017), in particular metal complexes of 8 hydroxyquinoline, for example aluminium(III) tris(8-hydroxyquinoline) (aluminium quinolate, $Alq_3$) or bis(2-methyl-8- quinolinolato)-4-(phenylphenolinolato)aluminium, also with imidazole chelate (US 2007/0092753 A1) and quinoline-metal complexes, aminoquinoline-metal complexes, benzoquinoline-metal complexes, the hole-conducting compounds (for example in accordance with WO 04/058911), the electron-conducting compounds, in particular ketones, phosphine oxides, sulfoxides, etc. (for example in accordance with WO 05/084081 and WO 05/084082), the atropisomers (for example in accordance with WO 06/048268), the boronic acid derivatives (for example in accordance with WO 06/117052) or the benzanthracenes (e.g. DE 102007024850). Particularly preferred host materials are selected from the classes of the oligoarylenes, containing naphthalene, anthracene, benzanthracene and/or pyrene, or atropisomers of these compounds, the ketones, the phosphine oxides and the sulfoxides. Very particularly preferred host materials are selected from the classes of the oligoarylenes, containing anthracene, benzanthracene and/or pyrene, or atropisomers of these compounds. For the purposes of this invention, an oligoarylene is intended to be taken to mean a compound in which at least three aryl or arylene groups are bonded to one another.

Preferred host materials are selected, in particular, from compounds of the Formula 57

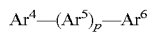    Formula 57 wherein
$Ar^4$, $Ar^5$, $Ar^6$ are on each occurrence, identically or differently, an aryl or heteroaryl group having 5 to 30 aromatic ring atoms, which may be substituted by one or more radicals and p is 1, 2, or 3,
the sum of the π-electrons in $Ar^4$, $Ar^5$ and $Ar^6$ is at least 30 if p=1 and is at least 36 if p=2 and is at least 42 if p=3.

It is particularly preferred in the host materials of the Formula 57 for the group $Ar^5$ to stand for anthracene, which may be substituted by one or more radicals $R^1$, and for the groups $Ar^4$ and $Ar^6$ to be bonded in the 9 and 10-positions. Very particularly preferably, at least one of the groups $Ar^4$ and/or $Ar^6$ is a condensed aryl group selected from 1- or 2-naphthyl, 2-, 3- or 9-phenanthrenyl or 2-, 3-, 4-, 5-, 6- or 7-benzanthracenyl, each of which may be substituted by one or more radicals $R^1$. Anthracene-based compounds are described in US 2007/0092753 A1 and US 2007/0252517 A1, for example 2-(4-methylphenyl)-9,10-di-(2-naphthyl)anthracene, 9-(2-naphthyl)-10-(1,1'-biphenyl)anthracene and 9,10-bis[4-(2,2-diphenylethenyl)phenyl]anthracene, 9,10-diphenylanthracene, 9,10-bis(phenylethynyl)anthracene and 1,4-bis(9'-ethynylanthracenyl)benzene. Preference is also given to compounds containing two anthracene units (US 2008/0193796 A1), for example 10,10'-bis[1,1',4',1"]terphenyl-2-yl-9,9'-bisanthracenyl.

Further preferred compounds are derivatives of arylamine, styrylamine, fluorescein, perynone, phthaloperynone, naphthaloperynone, diphenylbutadiene, tetraphenylbutadiene, cyclopentadienes, tetraphenylcyclopentadiene, pentaphenylcyclopentadiene, coumarine, oxadiazole, bisbenzoxazoline, oxazone, pyridine, pyrazine, imine, benzothiazole, benzoxazole, benzimidazole (US 2007/0092753 A1), for example 2,2',2"-(1,3,5-phenylene)tris[1-phenyl-1H-benzimidazole], aldazines, stilbene, styrylarylene derivatives, for example 9,10-bis[4-(2,2-diphenylethenyl)phenyl]anthracene, and distyrylarylene derivatives (U.S. Pat. No. 5,121,029), diphenylethylene, vinylanthracene, diaminocarbazole, pyran, thiopyran, diketopyrrolopyrrole, polymethine, mellocyanine, acridone, quinacridone, cinnamic acid esters and fluorescent dyes.

Particular preference is given to derivatives of arylamine and styrylamine, for example 4,4'-bis[N-(1-naphthyl)-N-(2-naphthyl)amino]biphenyl (TNB).

Metal-oxinoid complexes, such as lithium quinolate (Liq) or $Alq_3$, can be used as co-hosts.

Preferred compounds with oligoarylene as matrix are compounds as disclosed in, e.g., US 2003/0027016 A1, U.S. Pat. No. 7,326,371 B2, US 2006/043858 A, U.S. Pat. No. 7,326,371 B2, US 2003/0027016 A1, WO 2007/114358, WO 2008/145239, JP 3148176 B2, EP 1009044, US 2004/018383, WO 2005/061656 A1, EP 0681019 B1, WO 2004/013073 A1, U.S. Pat. No. 5,077,142, WO 2007/065678, and US 2007/0205412 A1. Particularly preferred oligoarylene-based compounds are compounds having the Formulae 58 to 64.

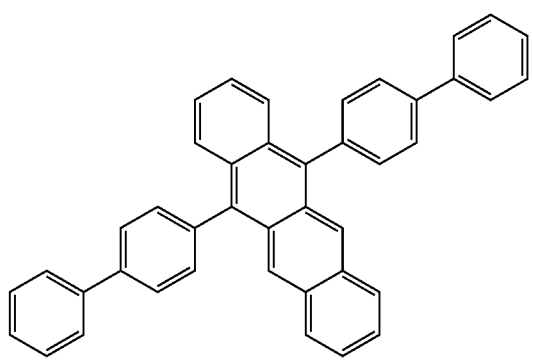

Formula 58

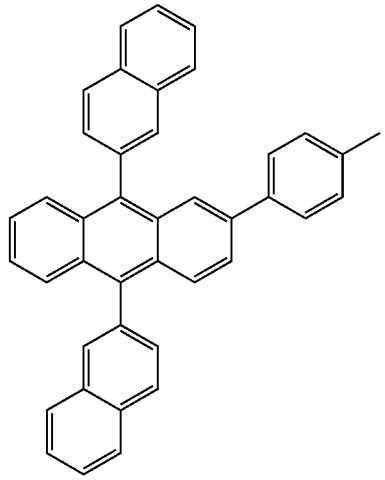

Formula 59

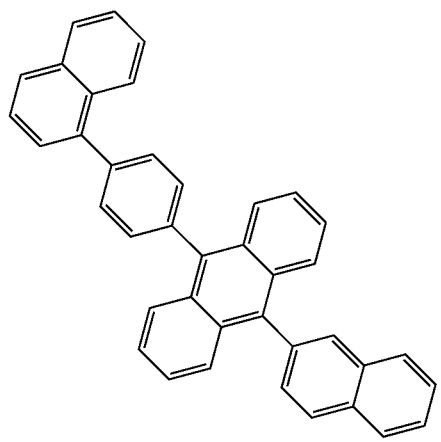

Formula 60

Formula 61

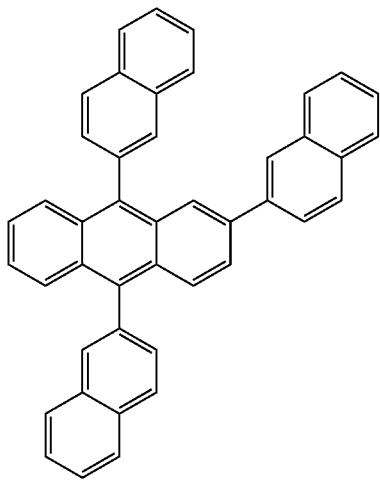

Formula 62

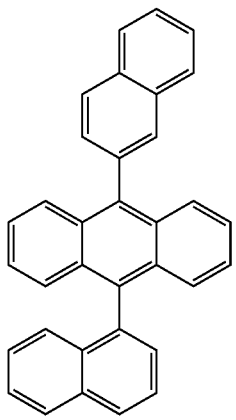

Formula 63

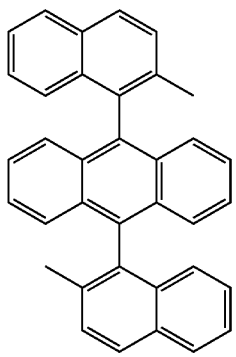

Formula 64

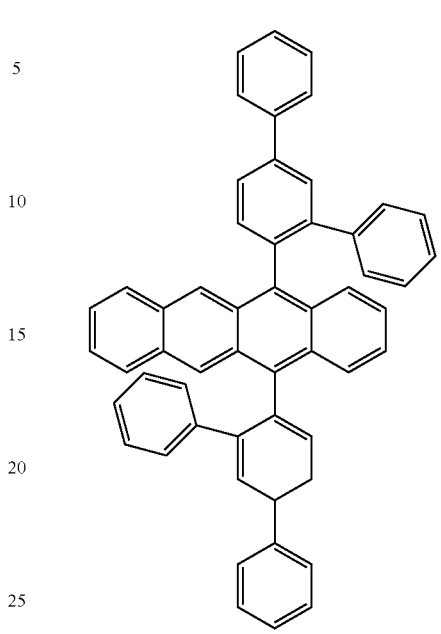

Further singlet host materials can be selected from spirobifluorene and derivates thereof, for example Spiro-DPVBi as disclosed in EP 0676461 and indenofluorene as disclosed in U.S. Pat. No. 6,562,485.

Particularly preferred monomeric host materials for singlet OLEDs are selected from benzanthracene, anthracene, triarylamine, indenofluorene, fluorene, spirobifluorene, phenanthrene, dihydrophenanthrene and isomers and derivatives thereof.

If a triplett emitter is employed for electroluminescence in OLEDs (phosphorescent OLEDs), the requirements the host material must fulfil are rather different from host materials in singlet OLEDs. The host materials in phosphorescent OLEDs are required to have a triplet level which is higher in energy as compared to the triplet level of the emitter. The host material can either transport electrons or holes or both of them. In addition, the emitter is supposed to have large spin-orbital coupling constants in order to facilitate singlet-triplet mixing sufficiently. This can be enabled by using metal complexes.

Preferred matrix materials are N,N-biscarbazolythiphenyl (CBP), carbazole derivatives (for example in accordance with WO 05/039246, US 2005/0069729, JP 2004/288381, EP 1205527 or DE 102007002714), azacarbazoles (for example in accordance with EP 1617710, EP 1617711, EP 1731584, JP 2005/347160), ketones (for example in accordance with WO 04/093207), phosphine oxides, sulfoxides and sulfones (for example in accordance with WO 05/003253), oligophenylenes, aromatic amines (for example in accordance with US 2005/0069729), bipolar matrix materials (for example in accordance with WO 07/137,725), silanes (for example in accordance with WO 05/111172), 9,9-diarylfluorene derivatives (e.g. in accordance with DE 102008017591), azaboroles or boronic esters (for example in accordance with WO 06/117052), triazole derivatives, oxazoles and oxazole derivatives, imidazole derivatives, polyarylalkane derivatives, pyrazoline derivatives, pyrazolone derivatives, distyrylpyrazine derivatives, thiopyran dioxide derivatives, phenylenediamine derivatives, tertiary aromatic amines, styrylamines, amino-substituted chalcone derivatives, indoles, styrylanthracene derivatives, aryl-substituted anthracene derivatives, such as, for example, 2,3,5,6-tetramethylphenyl-1,4-(bisphthalimide) (TMPP, US 2007-0252517 A1), anthraquinodimethane derivatives, anthrone derivatives, fluorenone derivatives, fluorenylidenemethane derivatives, hydrazone derivatives, stilbene derivatives, silazane derivatives, aromatic dimethylidene compounds, porphyrin compounds, carbodiimide derivatives, diphenylquinone derivatives, tetracarbocylic compounds, such as, for example, naphthaleneperylene, phthalocyanine derivatives, metal complexes of 8 hydroxyquinoline derivatives, such as, for example, Alq$_3$, the 8 hydroxyquinoline complexes may also contain triarylaminophenol ligands (US 2007/0134514 A1), various metal complex-polysilane compounds with metal phthalocyanine, benzoxazole or benzothiazole as ligand, electron-conducting polymers, such as, for example, poly(N-vinylcarbazole) (PVK), aniline copolymers, thiophene oligomers, polythiophenes, polythiophene derivatives, polyphenylene derivatives, polyphenylenevinylene derivatives, polyfluorene derivatives.

The materials can be used intrinsically or doped, such as, for example, intrinsic 4,4'-N,N-dicarbazolebiphenyl (=9,9'-[1,1'-biphenyl]-4,4'-diylbis-9H-carbazole) (CBP) or 2,9-dimethyl-4,7-diphenyl-1,10-phenanthroline (=bathocuproin) (BCP) doped with 4,4'-(bis(9-ethyl-3-carbazovinylene)-1,1'-biphenyl Examples of preferred carbazole derivatives are, 1,3-N,N-dicarbazolebenzene (=9,9'-(1,3-phenylene)bis-9H-carbazole) (mCP), 9,9'-(2,2'-dimethyl[1,1'-biphenyl]-4,4'-diyl)bis-9H-carbazole (CDBP), 1,3-bis(N,N'-dicarbazole)benzene (=1,3-bis(carbazol-9-yl)benzene), PVK (polyvinylcarbazole), 3,5-di(9H-carbazol-9-yl)biphenyl and compounds of the Formulae 65 to 69.

Formula 65

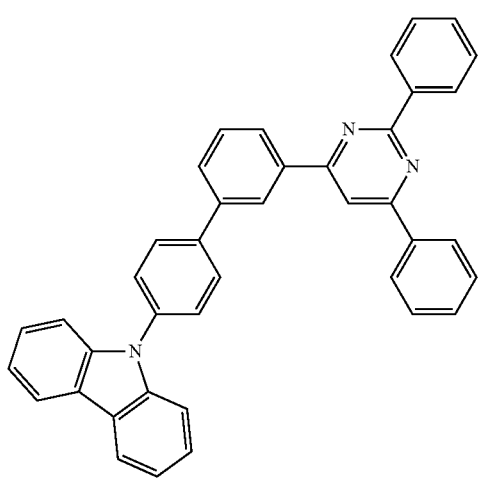

Formula 66

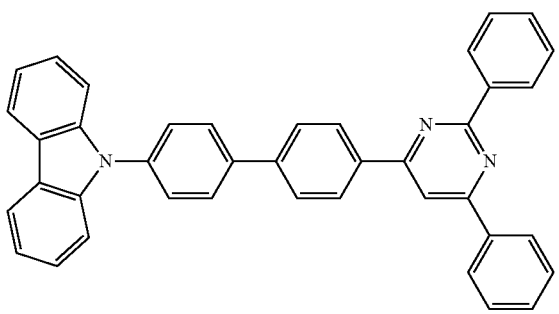

Formula 67

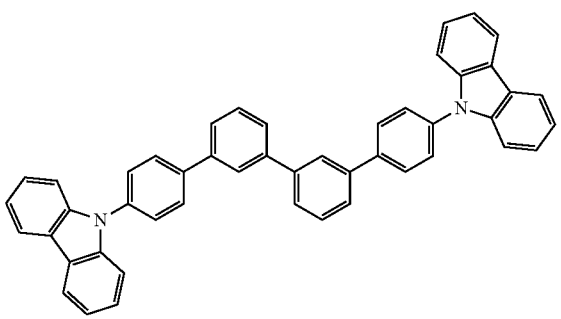

Formula 68

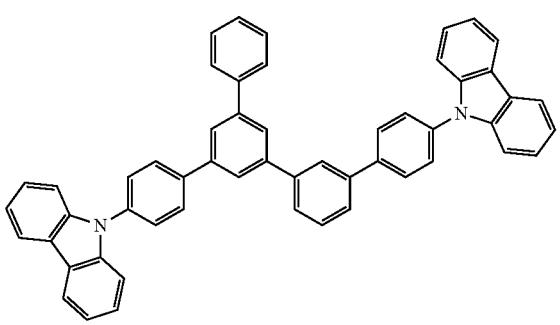

Formula 69

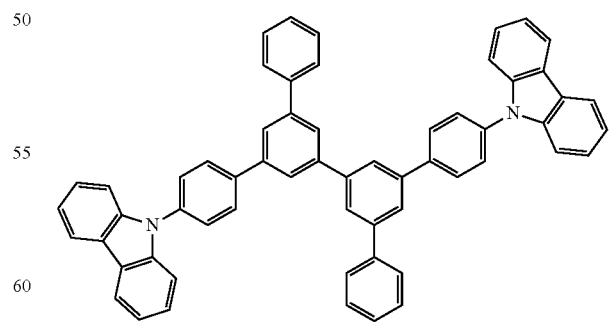

Preferred Si tetraaryl compounds are, for example, (US 2004-0209115, US 2004/0209116, US 2007/0087219 A1, US 2007/0087219 A1) the compounds of the Formulae 70 to 75.

Formula 70

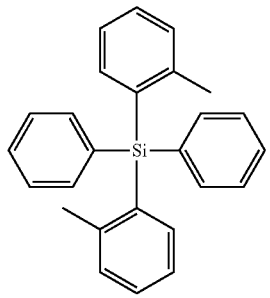

Formula 71

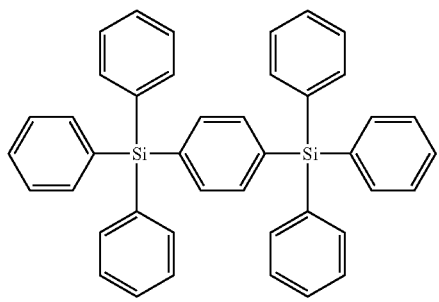

Formula 72

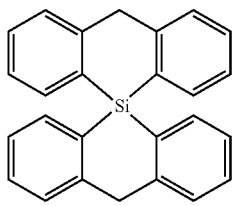

Formula 73

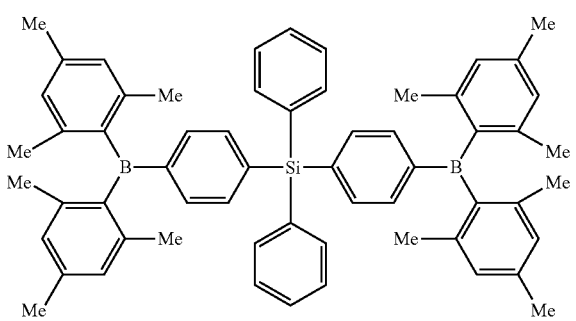

Formula 74

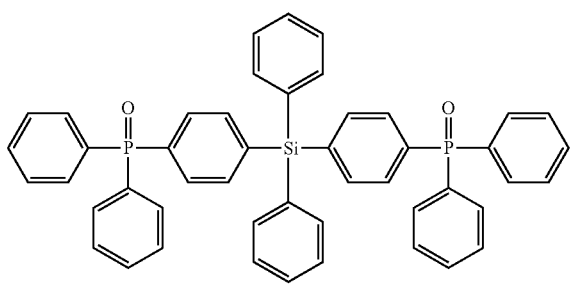

Formula 75

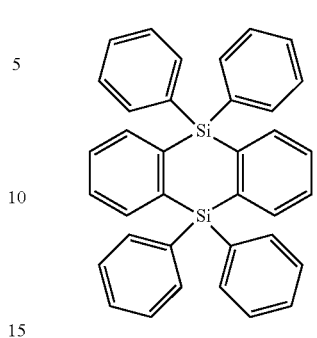

A particularly preferred matrix for phosphorescent dopants is the compound of Formula 76 (EP 652273 B1)

Formula 76

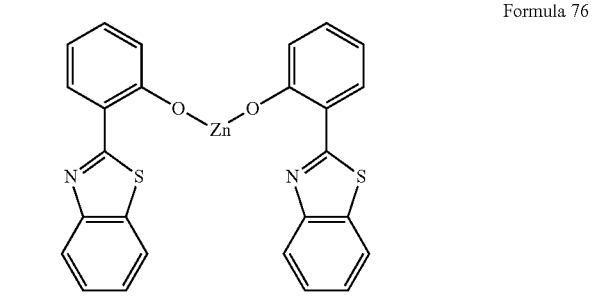

The emitter compound is required to have a smaller band gap as compared to the host compound. In general, smaller band gaps can be achieved by extending the π-electron system of conjugated molecular systems. Emitter compounds tend, therefore, to have more extended conjugated π-electron systems than host molecules. Many examples have been published, e.g. styrylamine derivatives as disclosed in JP 2913116B and WO 2001/021729 A1, and indenofluorene derivatives as disclosed in WO 2008/006449 and WO 2007/140847.

Preferred dopants are selected from the class of the monostyrylamines, the distyrylamines, the tristyrylamines, the tetrastyrylamines, the styrylphosphines, the styryl ethers and the arylamines.

A monostyrylamine is taken to mean a compound which contains one substituted or unsubstituted styryl group and at least one, preferably aromatic, amine. A distyrylamine is taken to mean a compound which contains two substituted or unsubstituted styryl groups and at least one, preferably aromatic, amine. A tristyrylamine is taken to mean a compound which contains three substituted or unsubstituted styryl groups and at least one, preferably aromatic, amine. A tetrastyrylamine is taken to mean a compound which contains four substituted or unsubstituted styryl groups and at least one, preferably aromatic, amine. The styryl groups are particularly preferably stilbenes, which may also be further substituted. The corresponding phosphines and ethers are defined analogously to the amines. For the purposes of this invention, an arylamine or an aromatic amine is taken to mean a compound which contains three substituted or unsubstituted aromatic or heteroaromatic ring systems bonded directly to the nitrogen. At least one of these aromatic or heteroaromatic ring systems is preferably a condensed ring system, preferably having at least 14 aromatic ring atoms. Preferred examples thereof are aromatic anthracene-amines, aromatic anthracene-diamines, aromatic pyrene-amines, aromatic pyrene-diamines, aromatic chrysene-amines and aromatic chrysene-diamines. An aromatic anthracene-amine is taken to mean a compound in which one diarylamino group is bonded directly to an anthracene group, preferably in the 9 position. An aromatic anthracene-diamine is taken to mean a compound in which two diarylamino groups are bonded directly to an anthracene group, preferably in the 9,10-position. Aromatic pyrene-amines, pyrene-diamines, chrysene-amines and chrysene-diamines are defined analogously thereto, where the diarylamino groups on the pyrene are preferably bonded in the 1 position or in the 1,6-position.

Further preferred dopants are selected from indenofluorene-amines and indenofluorene-diamines, for example in accordance with WO 06/122630, benzoindenofluorene-amines and benzoindenofluorene-diamines, for example in accordance with WO 08/006,449, and dibenzoindenofluorene-amines and dibenzoindenofluorene-diamines, for example in accordance with WO 07/140,847.

Examples of dopants from the class of the styrylamines are substituted or unsubstituted tristilbene-amines or the dopants described in WO 06/000388, WO 06/058737, WO 06/000389, WO 07/065,549 and WO 07/115,610. Distyrylbenzene and distyrylbiphenyl derivatives are described in U.S. Pat. No. 5,121,029. Further styrylamines are found in US 2007/0122656 A1.

Particularly preferred styrylamine dopants and triarylamine dopants are the compounds of the Formulae 77 to 82 and as disclosed in U.S. Pat. No. 7,250,532 B2, DE 10 2005 058557 A1, CN 1583691 A, JP 08053397 A, U.S. Pat. No. 6,251,531 B1, and US 2006/210830 A.

Formula 77

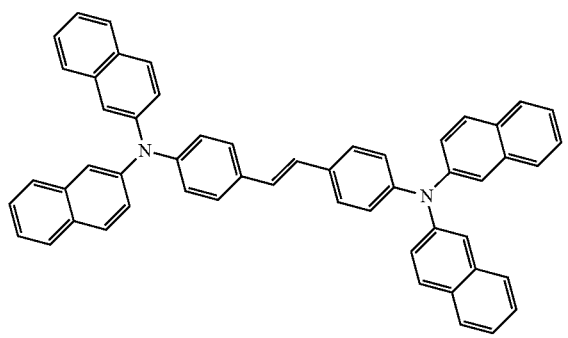

Formula 78

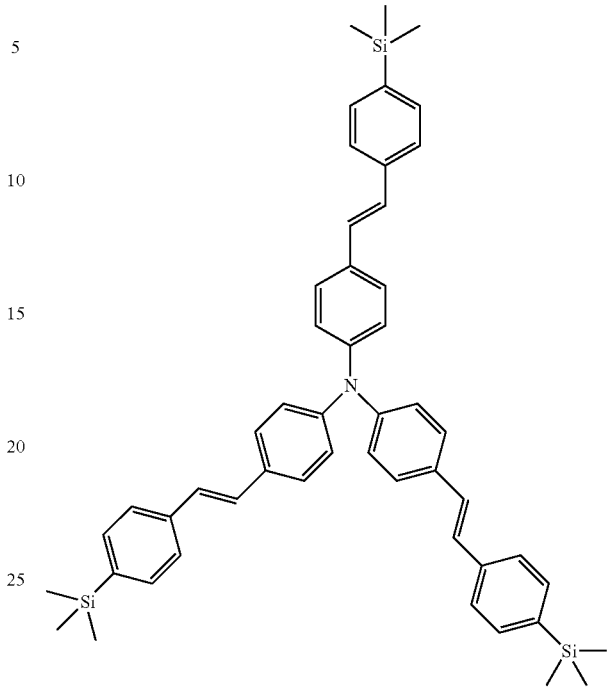

Formula 79

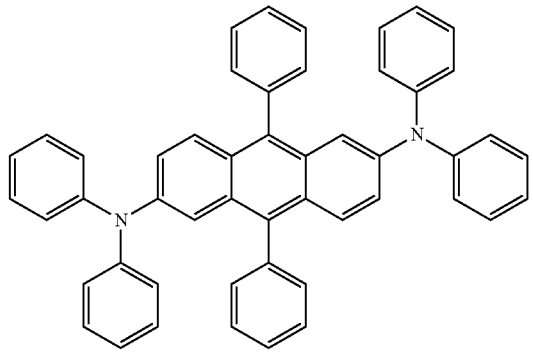

Formula 80

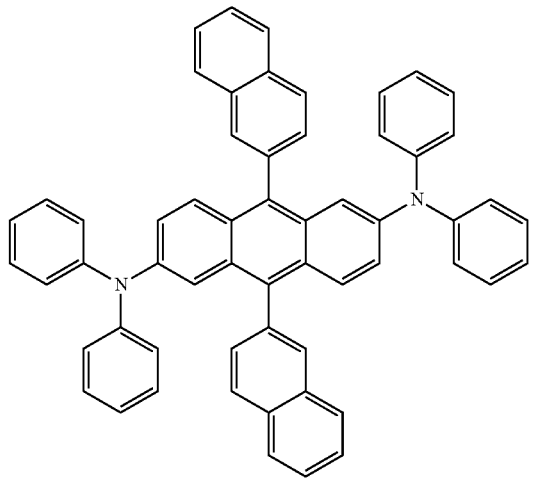

Formula 81

Formula 82

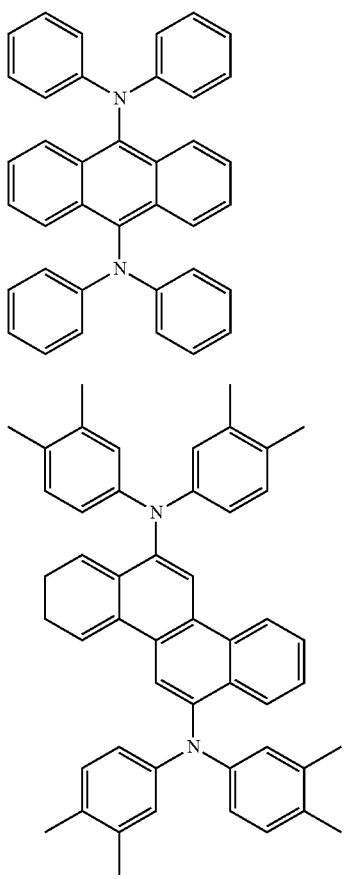

Further preferred dopants are selected from the group of triarylamines as disclosed in EP 1957606 A1 and US 2008/0113101 A1.

Further preferred dopants are selected from derivatives of naphthalene, anthracene, tetracene, fluorene, periflanthene, indenoperylene, phenanthrene, perylene (US 2007/0252517 A1), pyrene, chrysene, decacyclene, coronene, tetraphenylcyclopentadiene, pentaphenylcyclopentadiene, fluorene, spirofluorene, rubrene, coumarine (U.S. Pat. No. 4,769,292, U.S. Pat. No. 6,020,078, US 2007/0252517 A1), pyran, oxazone, benzoxazole, benzothiazole, benzimidazole, pyrazine, cinnamic acid esters, diketopyrrolopyrrole, acridone and quinacridone (US 2007/0252517 A1).

Of the anthracene compounds, particular preference is given to 9,10-substituted anthracenes, such as, for example, 9,10-diphenylanthracene and 9,10-bis(phenylethynyl)anthracene. 1,4-Bis(9'-ethynylanthracenyl)benzene is also a preferred dopant.

Blue fluorescent emitters are preferably polyaromatic compounds, such as, for example, 9,10-di(2-naphthylanthracene) and other anthracene derivatives, derivatives of tetracene, xanthene, perylene, such as, for example, 2,5,8,11-tetra-t-butylperylene, phenylene, for example 4,4'-(bis(9-ethyl-3-carbazovinylene)-1,1'-biphenyl, fluorene, arylpyrenes (US 2006/0222886), arylenevinylenes (U.S. Pat. No. 5,121,029, U.S. Pat. No. 5,130,603), derivatives of rubrene, coumarine, rhodamine, quinacridone, such as, for example, N,N'-dimethylquinacridone (DMQA), dicyanomethylenepyrane, such as, for example, 4 (dicyanoethylene)-6-(4-dimethylaminostyryl-2-methyl)-4H-pyrane (DCM), thiopyrans, polymethine, pyrylium and thiapyrylium salts, periflanthene, indenoperylene, bis(azinyl)imine-boron compounds (US 2007/0092753 A1), bis(azinyl)methene compounds and carbostyryl compounds.

Further preferred blue fluorescent emitters are described in C. H. Chen et al.: "Recent developments in organic electroluminescent materials" Macromol. Symp. 125, (1997), 1-48 and "Recent progress of molecular organic electroluminescent materials and devices" Mat. Sci. and Eng. R, 39 (2002), 143-222.

The term phosphorescence as used herein is defined as luminescence from an excited state with a spin multiplicity (2S+1) of larger than 1, wherein S is the spin. The excited state may be, for instance, a quintet or triplet state, preferably the excited state is a triplet state. Preferred phosphorescent molecules are luminescent complexes comprising iridium and platinum.

According to the definition as used herein luminescent transition metal complexes with elements of group 3 and 4 including luminescent lanthanide complexes are also phosphorescent materials.

Examples of phosphorescent emitters are revealed by the applications WO 00/70655, WO 01/41512, WO 02/02714, WO 02/15645, EP 1191613, EP 1191612, EP 1191614 and WO 05/033244. In general, all phosphorescent complexes as used in accordance with the prior art for phosphorescent OLEDs and as are known to the person skilled in the art in the area of organic electroluminescence are suitable, and the person skilled in the art will be able to use further phosphorescent complexes without inventive step.

The triplet emitter may be a metal complex, preferably with the formula $M(L)_z$, wherein M is a metal atom, L is in each occurrence independently of one another an organic ligand that is bonded to or coordinated with M via one, two or more positions, and z is an integer $\geq 1$, preferably 1, 2, 3, 4, 5 or 6, and wherein these groups are linked to the polymer via one or more, preferably one, two or three positions, preferably via the ligands L.

M is in particular a metal atom selected from transition metals, preferably selected from transition metals of group VIII, or lanthanoides, or actinides, particularly preferably selected from Rh, Os, Ir, Pt, Pd, Au, Sm, Eu, Gd, Tb, Dy, Re, Cu, Zn, W, Mo, Pd, Ag, or Ru, and very particularly preferably selected from Os, Ir, Ru, Rh, Re, Pd, or Pt. M may also be Zn.

Preferred ligands are 2 phenylpyridine derivatives, 7,8-benzoquinoline derivatives, 2 (2-thienyl)pyridine derivatives, 2 (1-naphthyl)pyridine derivatives or 2 phenylquinoline derivatives. All these compounds may be substituted, for example by fluoro- or trifluoromethyl substituents for blue. Auxiliary ligands are preferably acetylacetonate or picric acid.

In particular, complexes of Pt or Pd with tetradentate ligands of the Formula 83 as disclosed in US 2007/0087219 A1, wherein $R^1$ to $R^{14}$ and $Z^1$ to $Z^5$ are as defined in the reference, Pt porphyrin complexes having an enlarged ring system (US 2009/0061681 A1) and Ir complexes are suitable, for example 2,3,7,8,12,13,17,18-octaethyl-21H, 23H-porphyrin-Pt(II), tetraphenyl-Pt(II)-tetrabenzoporphyrin (US 2009/0061681 A1), cis-bis(2-phenylpyridinato-N,C2')Pt(II), cis-bis(2-(2'-thienyl)pyridinato-N,C3')Pt(II), cis-bis(2-(2'-thienyl)quinolinato-N,C5')Pt(II), (2-(4,6-difluorophenyl)pyridinato-N,C2')Pt(II) acetylacetonate, or tris(2-phenylpyridinato-N,C2')Ir(III) (Ir(ppy)3, green), bis(2-phenylpyridinato-N,C2)Ir(III) acetylacetonate (Ir(ppy)2 acetylacetonate, green, US 2001/0053462 A1, Baldo, Thompson et al. Nature 403, (2000), 750-753), bis(1-phenylisoquinolinato-N,C2')(2-phenylpyridinato-N,C2')iridium(III), bis(2-phenylpyridinato-N,C2')(1-phenylisoquinolinato-N,C2')iridium(III), bis(2-(2'-benzothienyl)pyridinato-N,C3')iridium(III) acetylacetonate, bis(2-(4',6'-difluorophenyl)pyridinato-N,C2')iridium(III) piccolinate (Firpic, blue), bis(2-(4',6'-difluorophenyl)pyridinato-N,C2')Ir(III) tetrakis(1-pyrazolyl)borate, tris(2-(biphenyl-3-yl)-4-tert-butylpyridine)iridium(III), (ppz)2Ir(5phdpym) (US 2009/0061681 A1), (45ooppz)2Ir (5phdpym) (US 2009/0061681 A1), derivatives of 2 phenylpyridine-Ir complexes, such as, for example, iridium(III) bis(2-phenylquinolyl-N,C2')acetylacetonate (PQIr), tris(2-phenylisoquinolinato-N,C3)Ir(III) (red), bis(2-(2'-benzo[4,5-a]thienyl)pyridinato-N,C3)Ir acetylacetonate ([Btp2Ir (acac)], red, Adachi et al. Appl. Phys. Lett. 78 (2001), 1622-1624).

Formula 83

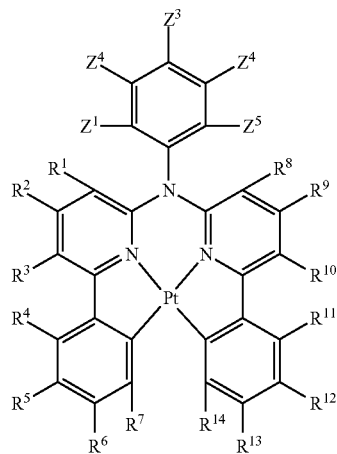

Also suitable are complexes of trivalent lanthanides, such as, for example, $Tb^{3+}$ and $Eu^{3+}$ (J. Kido et al. Appl. Phys. Lett. 65 (1994), 2124, Kido et al. Chem. Lett. 657, 1990, US 2007/0252517 A1), or phosphorescent complexes of Pt(II), KO, Rh(I) with maleonitrile dithiolate (Johnson et al., JACS 105, 1983, 1795), Re(I) tricarbonyl diimine complexes (Wrighton, JACS 96, 1974, 998 inter alia), Os(II) complexes with cyano ligands and bipyridyl or phenanthroline ligands (Ma et al., Synth. Metals 94, 1998, 245) or $Alq_3$ without a host.

Further phosphorescent emitters with tridentate ligands are described in U.S. Pat. No. 6,824,895 and U.S. Pat. No. 7,029,766. Red-emitting phosphorescent complexes are mentioned in U.S. Pat. No. 6,835,469 and U.S. Pat. No. 6,830,828.

A particularly preferred phosphorescent dopant is a compound with the Formula 84 and further compounds as disclosed, e.g., in US 2001/0053462 A1.

Formula 84

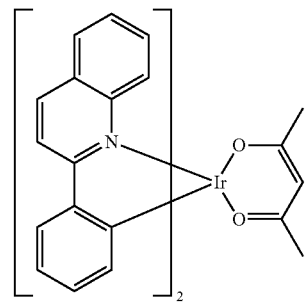

Further derivatives are described in U.S. Pat. No. 7,378,162 B2, U.S. Pat. No. 6,835,469 B2, and JP 2003/253145 A.

The emitter of the composition of the present invention can also be a copolymer, which is also called light emitting polymer (LEP). The LEP can have different functions. Beside emitting light, it can also transport either holes or electrons or both of them as outlined as follows.

Different structures are, inter alia, those as disclosed and extensively listed in WO 2002/077060 A1 and in DE 10337346 A1. These are regarded as part of the present invention by way of reference. The structural units may originate, for example, from the following classes:

Group 1: units which increase the hole-injection and/or -transport properties of the polymers;
Group 2: units which increase the electron-injection and/or -transport properties of the polymers;
Group 3: units which have combinations of individual units from group 1 and group 2;
Group 4: units which modify the emission characteristics to such an extent that electrophosphorescence may be obtained instead of electrofluorescence;
Group 5: units which improve the transition from the so-called singlet state to the triplet state;
Group 6: units which influence the morphology and/or emission colour of the resultant polymers;
Group 7: units which are typically used as backbone and which may have electron transport function, hole transport function or both.

Preferred polymers according to the invention are those in which at least one structural element has charge-transport properties, i.e. which comprise units from groups 1 and/or 2.

Structural elements from group 1, which have hole-transport properties, are, for example, triarylamine, benzidine, tetraaryl-para-phenylene-diamine, triarylphosphine, phenothiazine, phenoxazine, dihydrophenazine, thianthrene, dibenzo-para-dioxin, phenoxathiyne, carbazole, azulene, thiophene, pyrrole and furan derivatives and further O-, S- or N-containing heterocycles with a high HOMO (HOMO=highest occupied molecular orbital). These arylamines and heterocycles preferably result in an HOMO in the polymer of greater than −5.8 eV (against vacuum level), particularly preferably greater than −5.5 eV.

Structural elements from group 2, which have electron-transport properties, are, for example, pyridine, pyrimidine, pyridazine, pyrazine, oxadiazole, quinoline, quinoxaline and phenazine derivatives, but also triarylboranes and further O-, S- or N-containing heterocycles having a low LUMO (LUMO=lowest unoccupied molecular orbital). These units in the polymer preferably result in an LUMO of less than −2.7 eV (against vacuum level), particularly preferably less than −3.0 eV.

It may be preferred for the polymers according to the invention to comprise units from group 3 in which structures which increase the hole mobility and the electron mobility (i.e. units from groups 1 and 2) are bonded directly to one another. Some of these units may serve as emitters and shift the emission colour into the green, yellow or red. Their use is thus suitable, for example, for the production of other emission colours from originally blue-emitting polymers.

Structural units in accordance with group 4 are those which are able to emit light from the triplet state with high efficiency even at room temperature, i.e. exhibit electrophosphorescence instead of electrofluorescence, which frequently causes an increase in the energy efficiency. Suitable for this purpose are firstly compounds which contain heavy atoms having an atomic number of greater than 36. Preference is given to compounds which contain d- or f-transition metals which satisfy the above-mentioned condition. Particular preference is given here to corresponding structural units which contain elements from groups 8 to 10 (Ru, Os, Rh, Ir, Pd, Pt). Suitable structural units for the polymers according to the invention here are, for example, various complexes as described, for example, in WO 2002/068435 A1, DE 10116962 A1, EP 1239526 A2 and DE 10238903 A1. Corresponding monomers are described in WO 2002/068435 A1 and DE 10350606 A1.

Structural elements from group 5 are those which improve the transition from the singlet state to the triplet state and which, employed in support of the structural elements from group 4, improve the phosphorescence properties of these structural elements. Suitable for this purpose are, in particular, carbazole and bridged carbazole dimer units, as described in DE 10304819 A1 and DE 10328627 A1. Also suitable for this purpose are ketones, phosphine oxides, sulfoxides, sulfones, silane derivatives and similar compounds, as described in DE 10349033 A1.

Structural elements from group 6, which influence the morphology and/or emission colour of the polymers, are, besides those mentioned above, those which have at least one further aromatic or another conjugated structure which do not fall under the above-mentioned groups, i.e. which have only little effect on the charge-carrier mobilities, which are not organometallic complexes or which have no influence on the singlet-triplet transition. Structural elements of this type may influence the morphology and/or emission colour of the resultant polymers. Depending on the unit, they can therefore also be employed as emitters. Preference is given here to aromatic structures having 6 to 40 C atoms or also tolan, stilbene or bisstyrylarylene derivatives, each of which may be substituted by one or more radicals $R^1$. Particular preference is given here to the incorporation of 1,4-phenylene, 1,4-naphthylene, 1,4- or 9,10-anthrylene, 1,6-, 2,7- or 4,9-pyrenylene, 3,9- or 3,10-perylenylene, 4,4'-biphenylylene, 4,4"-terphenylylene, 4,4'-bi-1,1'-naphthylylene, 4,4'-tolanylene, 4,4'-stilbenzylene or 4,4"-bisstyrylarylene derivatives.

Structural elements from group 7 are units which contain aromatic structures having 6 to 40 C atoms which are typically used as polymer backbone. These are, for example, 4,5-dihydropyrene derivatives, 4,5,9,10-tetrahydropyrene derivatives, fluorene derivatives as disclosed for example in U.S. Pat. No. 5,962,631, WO 2006/052457 A2 and WO 2006/118345A1, 9,9'-spirobifluorene derivatives as disclosed for example in WO 2003/020790 A1, 9,10-phenanthrene derivatives as disclosed, for example, in WO 2005/104264 A1, 9,10-dihydrophenanthrene derivatives as disclosed for example in WO 2005/014689 A2,5,7-dihydrodibenzo-oxepine derivatives and cis- and trans-indenofluorene derivatives as disclosed for example in WO 2004041901 A1, WO 2004113412 A2 and, binaphthylene derivatives as disclosed for example in WO 2006/063852 A1, and further units as disclosed for example in WO 2005/056633A1, EP 1344788A1 and WO 2007/043495A1, WO 2005/033174 A1, WO 2003/099901A1 and DE 102006003710.3.

Preferred structural elements from group 7 are those of Formula 85:

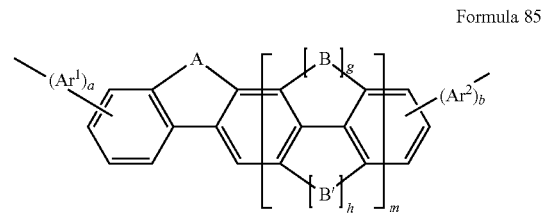

Formula 85 wherein

A, B and B' are independently of each other, and in case of multiple occurrence independently of one another, a divalent group, preferably selected from —$CR^1R^2$—, —$NR^1$—, —$PR^1$—, —O—, —S—, —SO—, —$SO_2$—, —CO—, —CS—, —CSe—, —P(=O)$R^1$—, —P(=S)$R^1$— and —$SiR^1R^2$—, $R^1$ and $R^2$ are independently of each other identical or different groups selected from H, halogen, —CN, —NC, —NCO, —NCS, —OCN, —SCN, —C(=O)$NR^0R^{00}$, —C(=O)X, —C(=O)$R^0$, —$NH_2$, —$NR^0R^{00}$, —SH, —$SR^0$, —$SO_3H$, —$SO_2R^0$, —OH, —$NO_2$, —$CF_3$, —$SF_5$, optionally substituted silyl, or carbyl or hydrocarbyl with 1 to 40 C atoms that is optionally substituted and optionally comprises one or more hetero atoms, and optionally the groups $R^1$ and $R^2$ form a spiro group with the fluorene moiety to which they are attached, X is halogen, $R^0$ and $R^{00}$ are independently of each other H or an optionally substituted carbyl or hydrocarbyl group optionally comprising one or more hetero atoms, each g is independently 0 or 1 and each corresponding h in the same subunit is the other of 0 or 1, m is an integer≥1, $Ar^1$ and $Ar^2$ are independently of each other mono- or polynuclear aryl or heteroaryl that is optionally substituted and optionally fused to the 7,8-positions or 8,9-positions of the indenofluorene group, a and b are independently of each other 0 or 1.

If the groups $R^1$ and $R^2$ form a spiro group with the fluorene group to which they are attached, it is preferably spirobifluorene.

The groups of Formula 85 are preferably selected from the following sub-Formulae 85a to 85e:

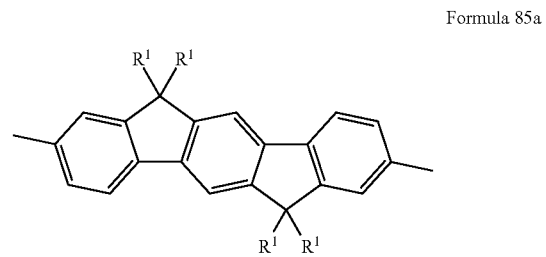

Formula 85a

-continued

Formula 85b

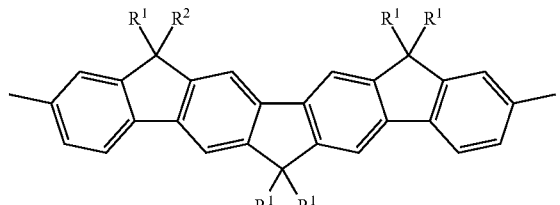

Formula 85c

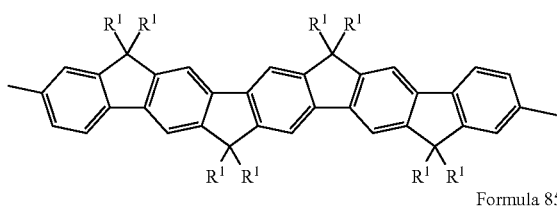

Formula 85d

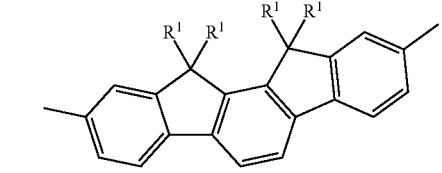

wherein R¹ is as defined in Formula 85, r is 0, 1, 2, 3 or 4, and R has one of the meanings of R¹.

R is preferably F, Cl, Br, I, —CN, —NO₂, —NCO, —NCS, —OCN, —SCN, —C(=O)NR°R°°, —C(=O)X°, —C(=O)R°, —NR°R°°, optionally substituted silyl, aryl or heteroaryl with 4 to 40, preferably 6 to 20 C atoms, or straight chain, branched or cyclic alkyl, alkoxy, alkylcarbonyl, alkoxycarbonyl, alkylcarbonlyoxy or alkoxycarbonyloxy with 1 to 20, preferably 1 to 12 C atoms, wherein one or more H atoms are optionally replaced by F or Cl, and wherein R°, R°° and X° are as defined above.

Preferred groups of Formula 85 are selected from the following sub-Formulae:

Formula 85f

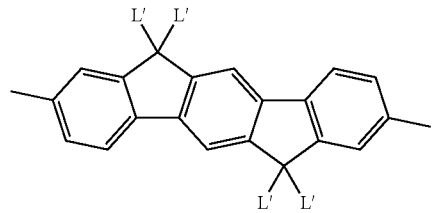

-continued

Formula 85g

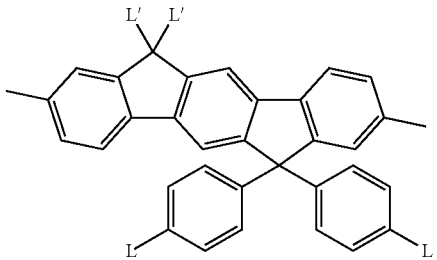

Formula 85h

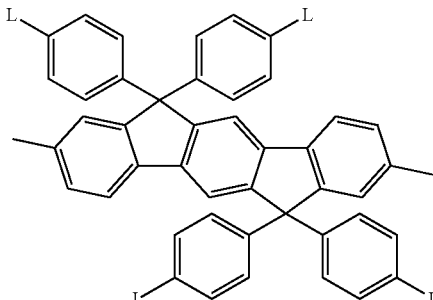

Formula 85i

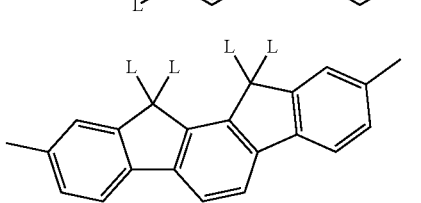

wherein
L is H, halogen or optionally fluorinated, linear or branched alkyl or alkoxy with 1 to 12 C atoms, and is preferably H, F, methyl, i-propyl, t-butyl, n-pentoxy, or trifluoromethyl, and L' is optionally fluorinated, linear or branched alkyl or alkoxy with 1 to 12 C atoms, and is preferably n-octyl or n-octyloxy.

Preference is given to polymers according to the invention which simultaneously comprise one or more units selected from groups 1 to 7. It may likewise be preferred for more than one structural unit from a group to be present simultaneously.

Preference is given to polymers according to the invention which, besides structural units of an emitter, also comprise at least one structural unit from the above-mentioned groups. At least two structural units are particularly preferably from different classes of those mentioned above.

The proportion of the different classes of groups, if present in the polymer, is preferably in each case at least 5 mol %, particularly preferably in each case at least 10 mol %. In particular, one of these structural units is selected from the group of hole-conducting units and the other group is an emitting unit, where these two functions (hole conduction and emission) may also be taken on by the same unit.

However, a smaller proportion of the emitting units, in particular green- and red-emitting units, may also be preferred, for example for the synthesis of white-emitting copolymers. The way in which white-emitting copolymers can be synthesised is described in detail in DE 10343606 A1.

In order to ensure adequate solubility, it is preferred for on average at least 2 non-aromatic C atoms to be present in the substituents per recurring unit. Preference is given here to at least 4 and particularly preferably at least 8 C atoms. In addition, individual C atoms of these may be replaced by O or S. However, it is entirely possible for this to mean that a certain proportion of recurring units does not carry any further non-aromatic substituents.

In order to avoid impairing the morphology of the film, it is preferred to have no long-chain substituents having more than 12 C atoms in a linear chain, particularly preferably none having more than 8 C atoms and in particular none having more than 6 C atoms.

The organic functional material of the composition of the present invention can also be a hole injection material (HIM). A HIM refers to a material or unit capable of facilitating holes (i.e. positive charges) injected from an anode into an organic layer or an anode. Typically, a HIM has a HOMO level comparable to or higher than the work function of the anode, i.e. −5.3 eV or higher.

Suitable compounds are triazole derivatives (U.S. Pat. No. 3,112,197), oxazole derivatives (U.S. Pat. No. 3,257,203), oxadiazole derivatives (U.S. Pat. No. 3,189,447), imidazole derivatives (JP Showa 37 (=1962) 16096), imidazolones, imidazole thiones, tetrahydroimidazoles, polyarylalkane derivatives (U.S. Pat. No. 3,615,402), pyrazoline and pyrazolone derivatives (U.S. Pat. No. 3,180,729 and U.S. Pat. No. 4,278,746), phenylenediamine derivatives (U.S. Pat. No. 3,615,404), arylamine derivatives (U.S. Pat. No. 3,567,450), amino-substituted chalcone derivatives (U.S. Pat. No. 3,526,501), styrylanthracene derivatives (JP Showa 54 (1979) 110837), hydrazone derivatives (U.S. Pat. No. 3,717,462), acylhydrazones, stilbene derivatives (JP Showa 61 (1986) 210363), silazane derivatives (U.S. Pat. No. 4,950,950), polysilane compounds (JP Heisei 2 (1990) 204996), PVK and other electrically conductive macromolecules, aniline-based copolymers (JP Helsei 2 (1990) 282263), electrically conductive, macromolecular thiophene oligomers (JP Heisei 1 (1989) 211399), PEDOT:PSS (spin-coated polymer), plasma-deposited fluorocarbon polymers (U.S. Pat. No. 6,127,004, U.S. Pat. No. 6,208,075, U.S. Pat. No. 6,208,077), porphyrin compounds (JP Showa 63 (1988) 2956965, U.S. Pat. No. 4,720,432), aromatic tertiary amines and styrylamines (U.S. Pat. No. 4,127,412), triphenylamines of the benzidine type, triphenylamines of the styrylamine type, and triphenylamines of the diamine type. Arylamine dendrimers can also be used (JP Heisei 8 (1996) 193191), as can phthalocyanine derivatives, naphthalocyanine derivatives, or butadiene derivatives, and quinoline derivatives, such as, for example, dipyrazino[2,3 f:2',3' h]quinoxaline hexacarbonitrile, are also suitable.

Inorganic compounds, such as p type Si and p type SiC, and inorganic oxides, e.g., vanadium oxide ($VO_x$) molybdenum oxide ($MoO_x$) or nickel oxide ($NiO_x$) can also be used.

Particular preference is given to the tertiary aromatic amines (US 2008/0102311 A1), for example N,N'-diphenyl-N,N'-di(3-tolyl)benzidine (=4,4'-bis[N-3-methylphenyl]-N-phenylamino)biphenyl (NPD) (U.S. Pat. No. 5,061,569), N,N'-bis(N,N'-diphenyl-4-aminophenyl)-N,N-diphenyl-4, 4'-diamino-1,1'-biphenyl (TPD 232) and 4,4',4"-tris[3-methylphenyl)phenylamino]-triphenylamine (MTDATA) (JP Heisei 4 (1992) 308688) or phthalocyanine derivatives (for example $H_2Pc$, CuPc, CoPc, NiPc, ZnPc, PdPc, FePc, MnPc, ClAlPc, ClGaPc, ClInPc, ClSnPc, $Cl_2SiPc$, (HO)AlPc, (HO)GaPc, VOPc, TiOPc, MoOPc, GaPc-O—GaPc).

Particular preference is given to the following triarylamine compounds of the Formulae 86 (TPD 232), 87, 88, and 89, which may also be substituted, and further compounds as disclosed in U.S. Pat. No. 7,399,537 B2, US 2006/0061265 A1, EP 1661888 B1, and JP 08292586 A.

Further compounds suitable as hole injection material are disclosed in EP 0891121 A1 and EP 1029909 A1. Hole injection layers in general are described in US 2004/0174116.

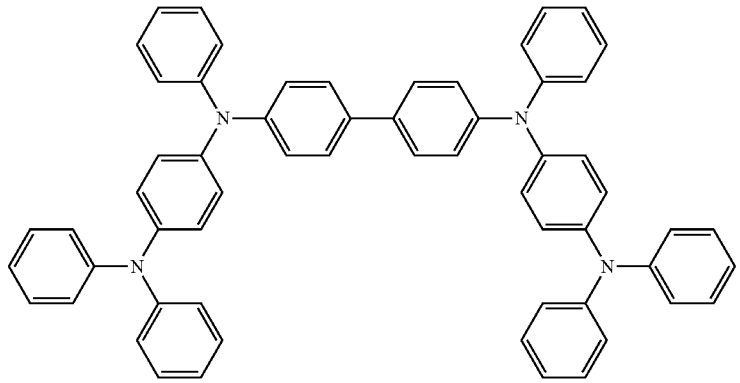

Formula 86

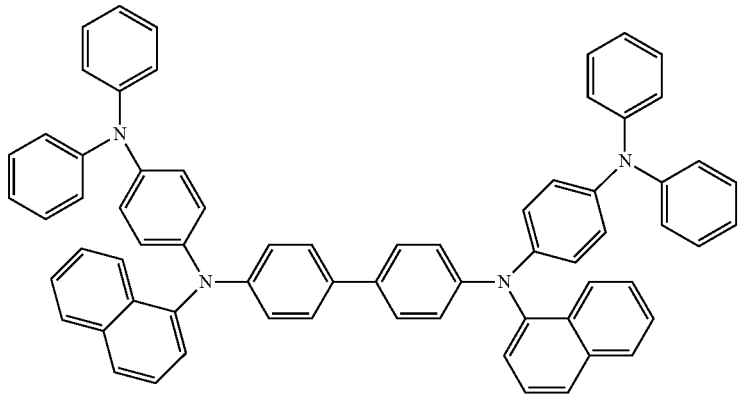

Formula 87

-continued

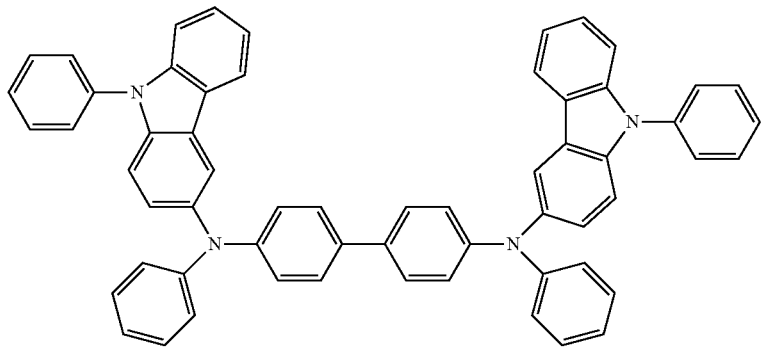

Formula 88

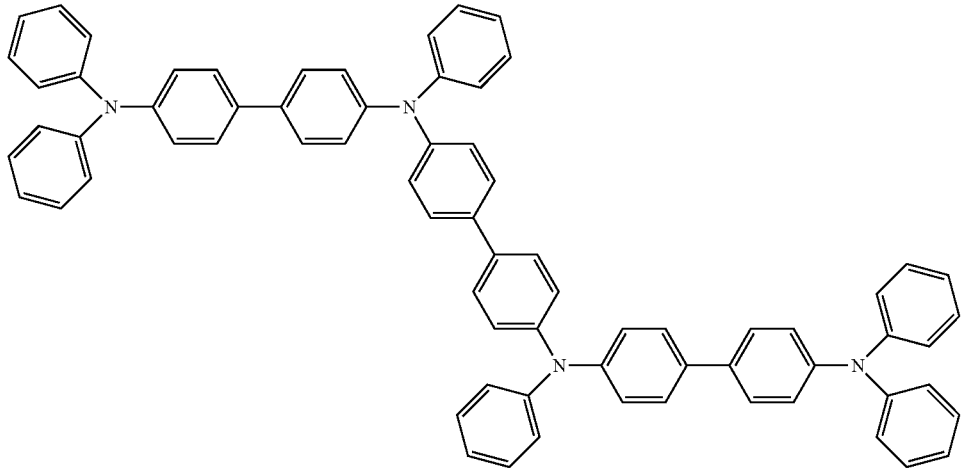

Formula 89

The organic functional material of the composition of the present invention can also be a hole transport material (HTM). A HTM is characterized in that it is a material or unit capable of transporting holes (i.e. positive charges) injected from a hole injecting material or an anode. A HTM has usually high HOMO, typically higher than −5.4 eV. In many cases, HIM can functions also as HTM, depending on the adjacent layer.

The hole transport material is selected from amines, triarylamines, thiophenes, carbazoles, phthalocyanines, porphyrines, isomers and derivatives thereof.

Preferably, the hole transport material is selected from amines, triarylamines, thiophenes, carbazoles, phthalocyanines, and porphyrines.

Suitable materials for hole-transporting layers are triazole derivatives (U.S. Pat. No. 3,112,197), oxazole derivatives (U.S. Pat. No. 3,257,203), oxadiazole derivatives (U.S. Pat. No. 3,189,447), imidazole derivatives (JP B 37-16096), pyrazoline and pyrazolone derivatives (U.S. Pat. No. 3,180,729), phenylenediamine derivatives (U.S. Pat. No. 3,615,404), arylamine derivatives (U.S. Pat. No. 3,567,450), amino-substituted chalcone derivatives (U.S. Pat. No. 3,526,501), styrylanthracene derivatives (JP A 56-46234), polycyclic aromatic compounds (EP 1009041), polyarylalkane derivatives (U.S. Pat. No. 3,615,402), fluorenone derivatives (JP A 54-110837), hydrazone derivatives (U.S. Pat. No. 3,717,462), stilbene derivatives (JP A 61-210363), silazane derivatives (U.S. Pat. No. 4,950,950), polysilanes (JP A 2-204996), aniline copolymers (JP A 2-282263), thiophene oligomers, polythiophenes, PVK, polypyrroles, polyanilines and further copolymers, such as, for example, an aqueous dispersion of poly(3,4-ethylenedioxythiophene) with polystyrene sulfonate (PEDOT/PSS), porphyrin compounds (JP A 63-2956965), aromatic dimethylidene-type compounds, carbazole compounds, such as, for example, CDBP, CBP, mCP, aromatic tertiary amine and styrylamine compounds (U.S. Pat. No. 4,127,412), monomeric triarylamines (U.S. Pat. No. 3,180,730), triarylamines containing one or more vinyl radicals and/or at least one functional group containing active hydrogen (U.S. Pat. No. 3,567,450 and U.S. Pat. No. 3,658,520) or tetraaryldiamines (the two tertiary amine units are bonded via an aryl group). Even more triarylamino groups may also be present in the molecule.

Preference is given to aromatic tertiary amines containing at least two tertiary amine units (U.S. Pat. No. 4,720,432 and U.S. Pat. No. 5,061,569), such as, for example, 4,4'-bis[N-(1-naphthyl)-N-phenylamino]biphenyl (NPD, NPB or α-NPB) (U.S. Pat. No. 5,061,569) or MTDATA (JP A 4-308688), N,N,N',N'-tetra(4-biphenyl)diaminobiphenylene (TBDB), 1,1-bis(4-di-p-tolylaminophenyl)cyclohexane (TAPC), 1,1-bis(4-di-p-tolylaminophenyl)-3-phenylpropane (TAPPP), 1,4-bis[2-[4-[N,N-di(p-tolyl)amino]phenyl]vinyl]benzene (BDTAPVB), N,N,N',N'-tetra-p-tolyl-4,4'-diaminobiphenyl (TTB), TPD, N,N,N',N'-tetraphenyl-4,4"-diamino-1, 1:4',1":4",1'''-quaterphenyl, likewise tertiary amines containing carbazole units, such as, for example, 4 (9H-carbazol-9-yl)-N,N-bis[4-(9H-carbazol-9-yl)phenyl]benzeneamine (TCTA).

Preference is likewise given to hexaazatriphenylene compounds in accordance with US 2007/0092755 A1.

Particular preference is given to the following triarylamine compounds of the Formulae 90 to 94, which may also be substituted, and as disclosed in EP 1162193 B1, EP 650955 B1, Synth. Metals 1997, 91 (1-3), 209, DE 19646119 A1, WO 2006/122630 A1, EP 1860097 A1, EP 1834945 A1, JP 08053397 A, and U.S. Pat. No. 6,251,531 B1.

Formula 90

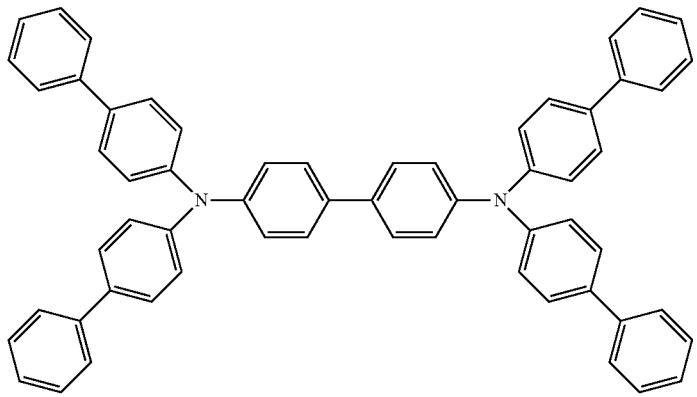

Formula 91

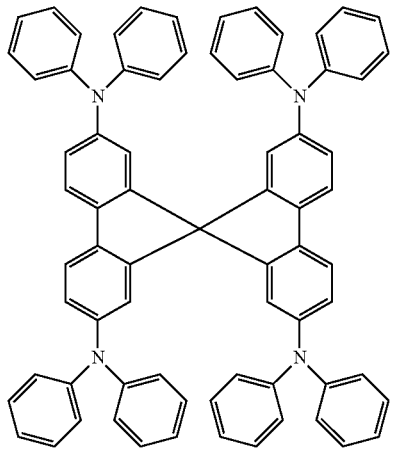

Formula 92

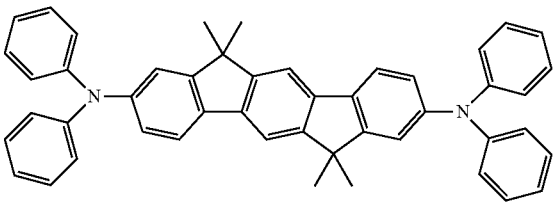

Formula 93

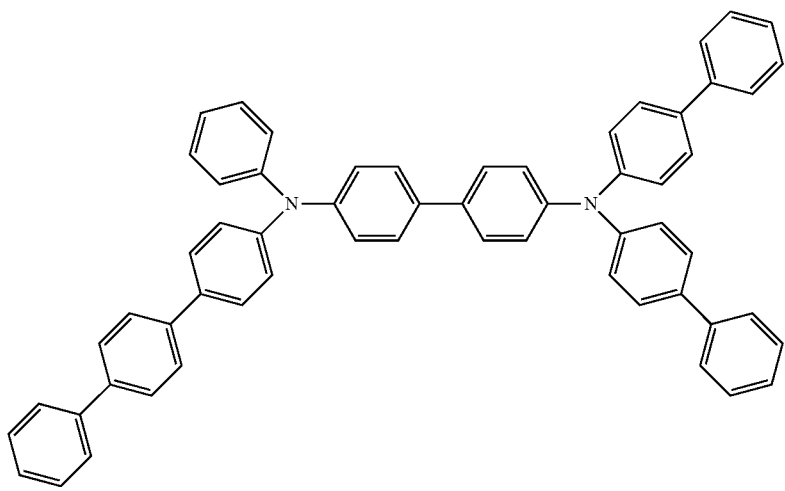

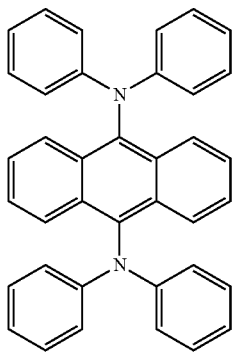

Formula 94

The organic functional material of the composition of the present invention can also be a hole blocking material (HBM). A HBM refers to a material or unit which, if coated adjacent to a hole transporting layer in a multilayer structure, prevents the holes flowing through. Usually it has a lower HOMO as compared to the HOMO level of the HTM in the adjacent hole transporting layer.

Hole-blocking layers are frequently inserted between the light-emitting layer and the electron-transport layer in devices comprising phosphorescent emitters.

Suitable hole-blocking materials are metal complexes (US 2003/0068528), such as, for example, bis(2-methyl-8-quinolinolato)(4-phenylphenolato)-aluminium(III) (BAlQ). Fac-tris(1-phenylpyrazolato-N,C2)iridium(III) (Ir(ppz)$_3$) is likewise used for this purpose (US 2003/0175553 A1). Phenanthroline derivatives, such as, for example, BCP, or phthalimides, such as, for example, TMPP, are likewise employed.

Suitable hole-blocking materials are described in WO 00/70655 A2, WO 01/41512 and WO 01/93642 A1.

The organic functional material of the composition of the present invention can also be an electron injection material (EIM). An Electron injection material refers to a material or unit capable of facilitating electrons (i.e. negative charges) injected from cathode into an organic layer. The EIM usually has a LUMO level comparable to or lower than the working function of cathode. Typically, the EIM has a LUMO lower than −2.6 eV.

A composition, characterized in that at least one organic functional material is a electron injection material, which comprises at least one organic compound selected from metal complexes of 8-hydroxyquinoline, heterocyclic organic compounds, fluorenones, fluorenylidene methane, perylenetetracarboxylic acid, anthraquinone dimethanes, diphenoquinones, anthrones, anthraquinonediethylene-diamines, isomers and derivates thereof is also subject of the present invention.

A composition, characterized in that at least one organic functional material is a electron injection material, which comprises at least one organic compound selected from metal complexes of 8-hydroxyquinoline, heterocyclic organic compounds, fluorenones, fluorenylidene methane, perylenetetracarboxylic acid, anthraquinone dimethanes, diphenoquinones, anthrones, and anthraquinonediethylene-diamines is also subject of the present invention.

Metal complexes of 8 hydroxyquinoline, such as, for example, Alq$_3$ and Gaq$_3$, can be used for electron-injection layers. A reducing doping with alkali metals or alkaline-earth metals, such as, for example, Li, Cs, Ca or Mg, at the interface to the cathode is advantageous. Preference is given to combinations which include Cs, for example Cs and Na, Cs and K, Cs and Rb or Cs, Na and K.

Heterocyclic organic compounds, such as, for example, 1,10-phenanthroline derivatives, benzimidazoles, thiopyran dioxides, oxazoles, triazoles, imidazoles or oxadiazoles, are likewise suitable. Examples of suitable five-membered rings containing nitrogen are oxazoles, thiazoles, oxadiazoles, thiadiazoles, triazoles, and compounds which are disclosed in US 2008/0102311 A1.

Preferred EIMs are selected from compounds with the Formulae 95 to 97, which may be substituted or unsubstituted.

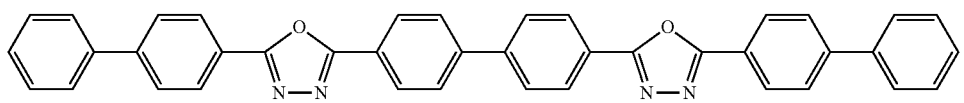

Formula 95

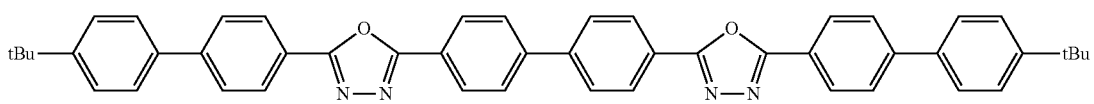

Formula 96

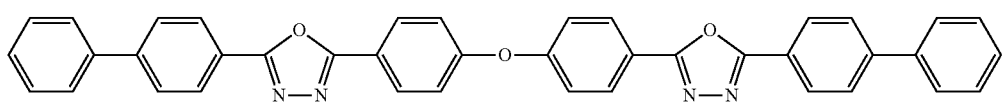

Formula 97

Organic compounds, such as fluorenones, fluorenylidene methane, perylenetetracarboxylic acid, anthraquinone dimethanes, diphenoquinones, anthrones and anthraquinonediethylenediamines, can also be employed, for example Formula 98

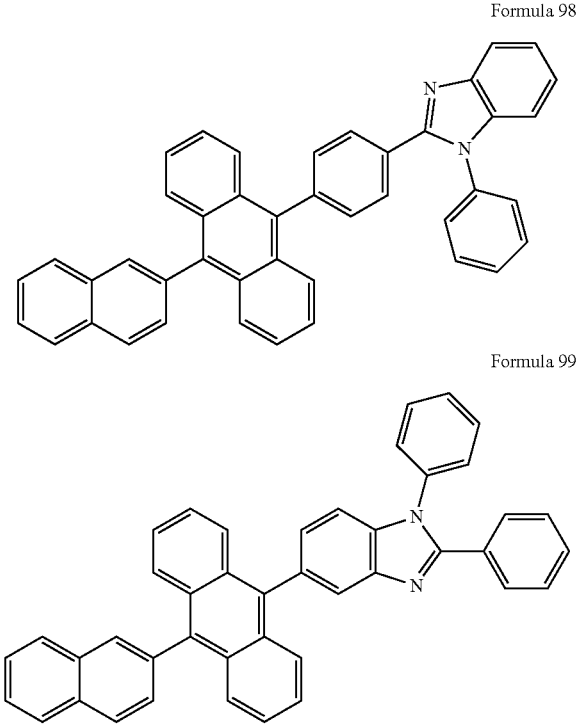

Formula 99

Electron injection layers (EILs) are often constructed from an insulator and semiconductor.

Preferred alkali metal chalcogenides are $Li_2O$, $LiO$, $Na_2S$, $Na_2Se$, $NaO$, $K_2O$, $Cs_2O$.

Preferred alkaline-earth metal chalcogenides are CaO, BaO, SrO, BeO, BaS, CaSe.

Preferred halides of alkali metals are LiF, NaF, KF, CsF, LiCl, KCl, NaCl.

Preferred halides of alkaline-earth metals are $CaF_2$, $BaF_2$, $SrF_2$, $MgF_2$, $BeF_2$.

It is likewise possible to employ alkali metal complexes, alkaline-earth metal complexes, rare-earth metals (Sc, Y, Ce, Th, Yb), rare-earth metal complexes, rare-earth metal compounds (preferably $YbF_3$, $ScF_3$, $TbF_3$) or the like.

The structure of EILs is described, for example, in U.S. Pat. No. 5,608,287, U.S. Pat. No. 5,776,622, U.S. Pat. No. 5,776,623, U.S. Pat. No. 6,137,223, U.S. Pat. No. 6,140,763, U.S. Pat. No. 6,914,269.

The organic functional material of the composition of the present invention can also be an electron transport material (ETM). The ETM refers to a material or unit capable of transporting electrons (i.e. negative charges) injected from an EIM or a cathode. The ETM has usually low LUMO, typically lower than −2.7 eV. In many cases, an EIM can serve as ETM as well, depending on the adjacent layer.

A composition, characterized in that at least one organic functional material is an electron transport material, which is selected from imidazoles, pyridines, pyrimidines, pyridazines, pyrazines, oxadiazoles, chinolines, chinoxalines, anthracenes, benzanthracenes, pyrenes, perylenes, benzimidazoles, triazines, ketones, phosphinoxides, phenazines, phenanthrolines, triarylboranes, isomers and derivatives thereof is also subject of the present invention.

An electron-transport layer may consist of an intrinsic material or comprise a dopant. $Alq_3$ (EP 278757 B1) and Liq (EP 0569827 A2) are examples of intrinsic layers. 4,7-diphenyl-1,10-phenanthroline (Bphen):Li 1:1 (US 2003/02309890) and rubrene/LiF are examples of doped layers.

Suitable compounds for electron-transporting layers are metal chelates of 8 hydroxyquinoline (for example Liq, $Alq_3$, $Gaq_3$, $Mgq_2$, $Znq_2$, $Inq_3$, $Zrq_4$), Balq, 4 azaphenanthrene-5-ol/Be complexes (U.S. Pat. No. 5,529,853 A; e.g. Formula 100), butadiene derivatives (U.S. Pat. No. 4,356,429), heterocyclic optical brighteners (U.S. Pat. No. 4,539,507), benzazoles, such as, for example, 1,3,5-tris(2-N-phenylbenzimidazolyl)benzene (TPBI) (U.S. Pat. No. 5,766,779, Formula 101), 1,3,5-triazines, pyrenes, anthracenes, tetracenes, fluorenes, spirobifluorenes, dendrimers, tetracenes, for example rubrene derivatives, 1,10-phenanthroline derivatives (JP 2003/115387, JP 2004/311184, JP 2001/267080, WO 2002/043449), silacyl-cyclopentadiene derivatives (EP 1480280, EP 1478032, EP 1469533), pyridine derivatives (JP 2004/200162 Kodak), phenanthrolines, for example BCP and Bphen, also a number of phenanthrolines bonded via biphenyl or other aromatic groups (US 2007/0252517 A1) or phenanthrolines bonded to anthracene (US 2007/0122656 A1, e.g. Formulae 102 and 103), 1,3,4-oxadiazoles, for example Formula 104, triazoles, for example Formula 105, triarylboranes, for example also with Si (e.g. Formula 73), benzimidazole derivatives and other N heterocyclic compounds (cf. US 2007/0273272 A1), silacyclopentadiene derivatives, borane derivatives, Ga oxinoid complexes.

Preference is given to 2,9,10-substituted anthracenes (with 1- or 2-naphthyl and 4- or 3-biphenyl) or molecules which contain two anthracene units (US 2008/0193796 A1).

Formula 100

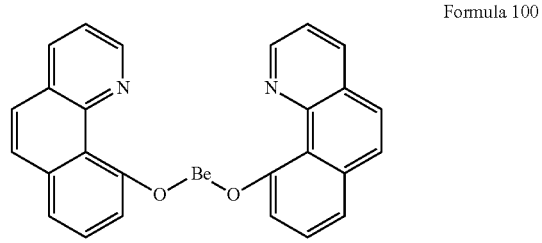

Formula 101

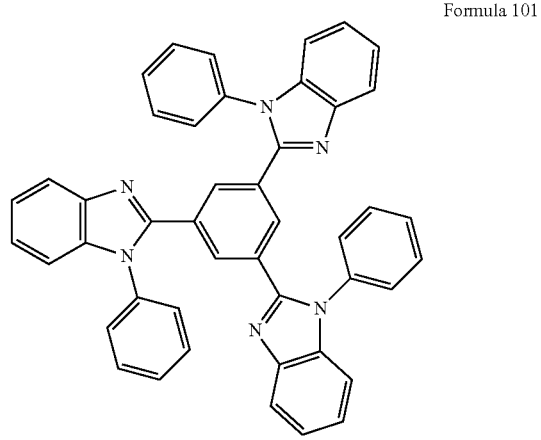

Formula 102

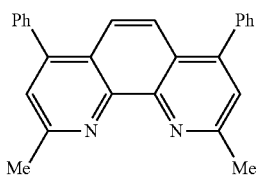

Formula 103

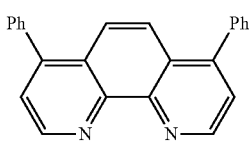

Formula 104

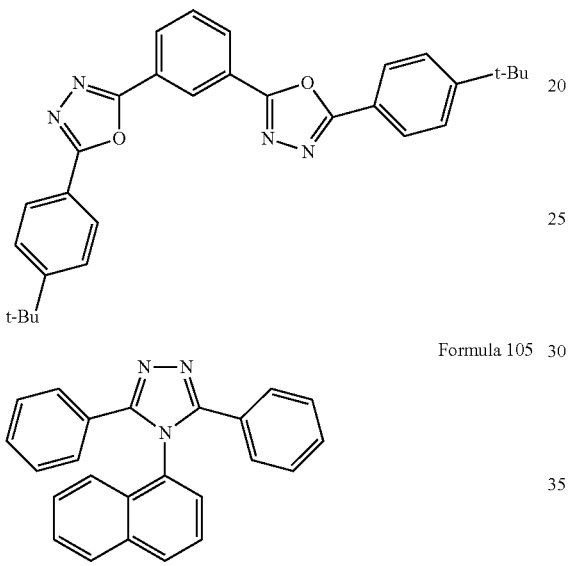

Formula 105

Preference is likewise given to anthracene-benzimidazole derivatives, such as, for example, the compounds of Formulae 106 to 108, and as disclosed in, e.g., U.S. Pat. No. 6,878,469 B2, US 2006/147747 A, and EP 1551206 A1.

Formula 106

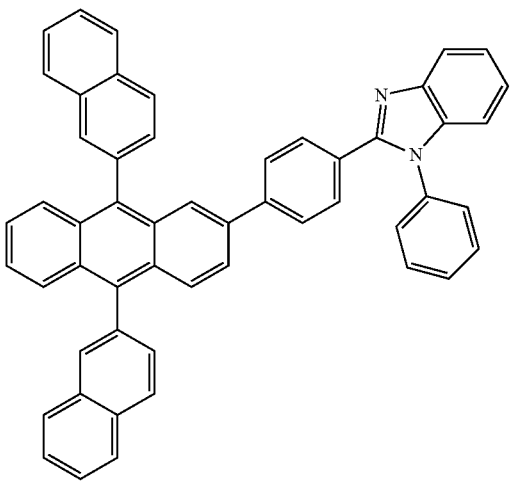

Formula 107

Formula 108

The organic functional material of the composition of the present invention can also be an electron blocking material (EBM). The EBM refers to a material or unit which, if coated adjacent to an electron transporting layer in a multilayer structure, prevents the electron flowing through. Usually it has a higher LUMO as compared to the LUMO of the ETM in the adjacent electron transporting layer.

Transition-metal complexes, such as, for example, Ir(ppz)$_3$ (US 2003/0175553) can be employed as materials for an electron-blocking layer.

The organic functional material of the composition of the present invention can also be an excitone blocking material (ExBM). The ExBM refers to a material or unit which, if coated adjacent to an emissive layer in a multilayer structure, prevents the exciton diffuse through. ExBM should have either a higher triplet level or singlet level as compared to the emissive layer or other adjacent layer.

Substituted triarylamines, such as, for example, MTDATA or 4,4',4"-tris(N,N-diphenylamino)triphenylamine (TDATA), can be used as materials for electron-blocking layers. Substituted triarylamines are described, for example, in US 2007/0134514 A1.

N-substituted carbazole compounds, such as, for example, TCTA, or heterocycles, such as, for example, BCP, are also suitable.

Metal complexes, such as, for example, Ir(ppz)$_3$ or Alq$_3$, can likewise be used for this purpose.

The organic functional material of the composition of the present invention can also be a dye. A dye can generally be described as an inorganic or organic substance that absorbs light and, therefore, appears colored.

Thus, the compositions of the present invention can comprise at least one organic functional material which is a dye, which is selected from perylenes, ruthenium dyes, phthalocyanines, azo dyes, perylene-diimides, porphyrines, squaraines, isomers and derivatives thereof.

Preferably the dye is selected from perylenes, ruthenium dyes, phthalocyanines, azo dyes, perylene-diimides, porphyrines, and squaraines.

Further dyes are selected from acridines, anthraquinones, arylmethanes, diarylmethanes, triarylmethanes, azo-based dyes, cyanines, diazonium-based dyes, nitro-based dyes, nitroso-based dyes, quinone-imines, azin-based dyes, eurhodines, safranines, indulines, indamins, indophenoles, oxazines, oxazones, thiazines, thiazoles, xanthenes, fluorenes, pyronines, fluorones, and rhodamines.

The organic functional material of the composition of the present invention can also be any metal complex.

A composition, characterized in that at least one organic functional material is a metal complex, wherein the metal is selected from transition metals, rare earth elements, lanthanides and actinides is also subject of this invention. Preferably the metal is selected from Ir, Ru, Os, Eu, Au, Pt, Cu, Zn, Mo, W, Rh, Pd, or Ag is also subject of the present invention.

The compositions of the present invention can be employed in electronic and opto-electronic devices. In particular the compositions can be used in electronic devices selected from, but not limited to, light emitting, light harvesting, and light sensor devices. The present invention, thus, relates to the use of the compositions as described herein in electronic and opto-electronic devices.

The compositions according to the present invention or formulations comprising the compositions of the present invention may be used to further technical processing. A formulation can be understood as mixture of organic functional materials as outlined in the present invention and at least one further non-functional compound acting as solvent. The solvent may be removed in a processing step or may not.

The present invention, thus, relates to a formulation comprising at least one nano-diamondoid and at least one solvent.

The nano-diamondoid may be selected from the group of nano-diamondoids as described above.

A formulation comprising a composition according to the present invention and at least one organic solvent is also subject of the present invention.

Preferably the at least one solvent is selected from the group of organic solvent, particularly preferably the solvent is selected from dichloromethane, trichloromethane, monochlorobenzene, o-dichlorobenzene, tetrahydrofuran, anisole, morpholine, toluene, o-xylene, m-xylene, p-xylene, 1,4-dioxane, acetone, methylethylketone, 1,2-dichloroethane, 1,1,1-trichloroethane, 1,1,2,2-tetrachloroethane, ethyl acetate, n-butyl acetate, dimethylformamide, dimethylacetamide, dimethylsulfoxide, tetralin, decalin, indane and mixtures thereof.

The concentration of the nano-diamondoid(s) or the composition according to this invention in the formulation is 0.001 to 50 wt %, preferably 0.01 to 20 wt %, particularly preferably 0.1 to 10 wt %, and very particularly preferably 0.1 to 5 wt %. Optionally, the solution also comprises at least one binder to adjust the rheological properties, as described in WO 2005/055248 A1.

After appropriate mixing and aging, the formulations are assigned to one of the following categories: complete solution, borderline solution or insoluble. The contour line is drawn to outline the solubility parameter-hydrogen bonding limits dividing solubility and insolubility. 'Complete' solvents falling within the solubility area can be chosen from literature values such as published in "Crowley, J. D., Teague, G. S. Jr and Lowe, J. W. Jr., Journal of Paint Technology, 38, No 496, 296 (1966)". Solvent blends may also be used and can be identified as described in "Solvents, W. H. Ellis, Federation of Societies for Coatings Technology, p 9-10, 1986". Such a procedure may lead to a blend of 'non' solvents that will dissolve both nano-diamondoid and the additional functional compounds of the present invention, although it is desirable to have at least one true solvent in a blend.

Another aspect of the present invention relates to the use of a composition or formulation according to the present invention for the preparation of an electronic or opto-electronic device.

The compositions and formulations according to the present invention are characterized in that they have, as described above, particular electronic properties, such as conductors or semiconductors and may therefore be used in any kind of electronic device. Preferably the compositions and formulations according to the present invention may be used in opto-electronic devices, where the absorption or emission of electromagnetic radiation preferably in the ultraviolet, visible or infrared part of the spectrum, plays a crucial role, such as light emitting devices, light sensors or light harvesting devices (e.g. photovoltaic cells). Whenever solely the term "electronic device" is used herein both electronic and/or opto-electronic device are meant.

The electronic devices of the present invention are characterized in that between the electrodes no vacuum occurs. Instead, thin layers of inorganic or organic materials are located.

The compositions and formulations according to this invention can be employed to build electronic and opto-electronic devices.

The present invention, therefore, relates to an electronic device comprising at least one organic layer and at least two electrodes, characterized in that at least one of the organic layers comprises at least one nano-diamondoid.

The nano-diamondoids used are the same as described above. The nano-diamondoids can be hydrogen-terminated or functionalized as described above. An electronic device, characterized in that the nano-diamondoid is hydrogen-terminated or functionalized is therefore also subject of the present invention.

In a preferred embodiment the present invention relates to an electronic device, characterized in that the at least one nano-diamondoid is selected from adamantane, diamantane, triamantane, tetramantane, pentamantane, cyclohexamantane, decamantane, higher diamondoids, and isomers and derivatives thereof.

The layer can also consists of at least one hydrogen-terminated or functionalized nano-diamondoid. Therefore, an electronic device, characterized in that at least one organic layers consists of at least one nano-diamondoid is also subject of the present invention. Another embodiment of the present invention is that at least one of these layers is a monolayer. More than one monolayer of this type may be present in the electronic or opto-electronic device. The monolayer can additionally comprise at least one organic functional material as defined above.

The electronic device of the present invention may also comprise at least one composition or formulation as described above. Another subject of the present invention is, therefore, an electronic device according the present invention, characterized in that at least one of the organic layers comprises at least one composition as described above.

The electronic device may comprise different layers comprising nano-diamondoids. According to this invention the device may comprise one or more organic layer comprising a composition comprising one or more nano-diamondoids and, in addition, one or more layers comprising monolayer of nano-diamondoids. Furthermore, the device according to the present invention may also comprise either only at least one layer comprising a composition of at least one nano-diamondoid and further organic functional materials as described above or only at least one layer comprising at least one nano-diamondoid, which may form a monolayer.

Characteristics and preparation of the monolayers are described in Science 2007, 316, 1460-1462.

Preferably the electronic device has 2, 3, 4, 5, or 6 electrodes.

In another preferred embodiment the present invention relates to an electronic device comprising two electrodes wherein the first electrode is an anode and the second electrode is a cathode.

Preferred materials for the anode are metal oxides selected from, but not limited to, indium tin oxide (ITO), indium zinc oxide (IZO), tin oxide (SnO), ZnO, InO, aluminium-zinc-oxide (AlZnO), and other metal oxides such as Al- and In-zinc oxide doped with zinc oxide, magnesium-indium-oxide, and nickel-tungsten-oxide. Metal nitrides such as galliumnitrides and metal selenides such as zinc-selenide and metal-sulfides such as zinc-sulfide can also be used. Further materials that can be used for anodes are electrically conducting polymers, e.g. polythiophenes and polypyrroles.

The anode can be transparent, opaque, or reflective. The anode can also adopt an intermediate state, e.g. both being partially reflective and partially transparent.

If the anode is not or only partially transparent further conducting materials can be used. Preferred materials for non transparent or partially transparent anodes are selected from, but not limited to, Au, Ir, Mo, Pd, Pt, Cu, Ag, Sn, C, Al, V, Fe, Co, Ni, W, and mixtures thereof. The conducting materials can also be mixed with further conducting materials as described above, e.g. In—Cu.

The anode is preferably transparent and a particularly preferred material for the anode is ITO. In the case of a bottom-emitting device glass or plastic is preferably coated with ITO. In the case of a top-emitting device the anode comprises preferably a reflecting material. Further materials can be used for anodes, which are known to the person skilled in the art.

A flexible and transparent combination of substrate and anode is described in U.S. Pat. No. 5,844,363 B2 and U.S. Pat. No. 6,602,540 B2, for instance.

The cathode can be transparent, opaque, or reflective. The cathode is selected from a metal or an alloy with a low work function. Preferably metals, alloys, or conducting compounds or materials with a work function of less than 4.0 eV are used. Particularly preferred cathodes are selected from, but not limited to, Ba, Ca, Sr, Yb, Ga, Cd, Si, Ta, Sb, Zn, Mg, Al, In, Li, Na, Cs, Ag, mixtures of two or more elements such as alloys comprising Mg/Al or Al/Li or Al/Sc/Li or Mg/Ag or metal oxides such as ITO or IZO.

Further preferred materials for cathodes, used to form a thin dielectric layer, are selected from a metal which is mixed with LiF, $Li_2O$, $BaF_2$, MgO, or NaF. A typical combination is LiF/Al.

An Mg/Al cathode with ITO layer on top is described in U.S. Pat. No. 5,703,436, U.S. Pat. No. 5,707,745, U.S. Pat. No. 6,548,956 B2, U.S. Pat. No. 6,576,134 B2. An Mg/Ag alloy is described in U.S. Pat. No. 4,885,221.

The substrate may be rigid or flexible. It may be transparent, translucent, opaque or reflective. The materials used can be glass, plastic, ceramic or metal foils, where plastic and metal foils are preferably used for flexible substrates. However, semiconductor materials, such as, for example, silicone wafers or printed circuit board (PCB) materials, can also be employed in order to simplify the generation of conductor tracks. Other substrates can also be employed.

The glass used can be, for example, soda-lime glass, Ba- or Sr-containing glass, lead glass, aluminium silicate glass, borosilicate glass, Ba borosilicate glass or quartz.

Plastic plates can consist, for example, of polycarbonate resin, acrylic resin, vinyl chloride resin, polyethylene terephthalate resin, polyimide resin, polyester resin, epoxy resin, phenolic resin, silicone resin, fluorine resin, polyether sulfide resin or polysulfone resin.

For transparent films, use is made, for example, of polyethylene, ethylene-vinyl acetate copolymers, ethylene-vinyl alcohol copolymers, polypropylene, polystyrene, polymethyl methacrylate, PVC, polyvinyl alcohol, polyvinylbutyral, nylon, polyether ether ketone, polysulfone, polyether sulfone, tetrafluoroethylene-perfluoroalkyl vinyl ether copolymers, polyvinyl fluoride, tetrafluoroethylene-ethylene copolymers, tetrafluoroethylene-hexafluoropropylene copolymers, polychlorotrifluoroethylene, polyvinylidene fluoride, polyester, polycarbonate, polyurethanes, polyimide or polyether imide.

The substrate is provided with a hydrophobic layer. The substrates are preferably transparent.

Other materials than those mentioned here can also be used. Suitable materials are known to the person skilled in the art.

An electronic, characterized in that at least one nano-diamondoid is mixed into at least one functional layer which is selected from hole injection layers, hole transport layers, electron blocking layers, emissive layers, hole blocking layers, exciton blocking layers, electron transport layers, electron injection layers, and photoabsorption layers is also subject of the present invention.

A photoabsorption layer comprises at least one dye as defined above.

The present invention also relates to an electronic device, characterized in that at least one nano-diamondoid is mixed into at least one electron injection layer. Any material suitable as EIM can be used, preferred EIMs are described above.

An electronic device, characterized in that the organic layer comprising at least one nano-diamondoid is adjacent to at least one electrode is a preferred embodiment of the present invention.

In a further preferred embodiment of the present invention the electronic device is characterized in that the organic layer comprising at least one nano-diamondoid is adjacent to the cathode.

Preferred cathodes comprise Au, Ag, and ITO.

An electronic device, characterized in that the at least one organic layer comprising at least one nano-diamondoid comprises at least one further organic compound selected from aromatic and heteroaromatic systems is also subject of the present invention.

The at least one further organic compound is selected from the group of host materials, EIMs, ETMs, EBMs, HIMs, HTMs, HBMs, photoabsorption materials, ExBMs, dyes, and metal complexes as described above.

Any aromatic and heteroaromatic system can be employed, preferably it is selected from the compounds described above.

The electronic devices of the present invention can be used to emit, harvest, and sense light. Therefore, the present invention also relates to an electronic device, characterized in that the device is light emitting, light converting, light harvesting, or light sensing selected from the group of solar cells, photodiodes, and sensors.

Preferably the electronic device is selected from organic light emitting diodes (OLED), polymer light emitting diodes (PLED), organic light emitting electrochemical cells, organic field effect transistors (OFET), thin film transistors (TFT), organic solar cells (O-SC), organic laser diodes (G-laser), organic integrated circuits (O-IC), radio frequency identification (RFID) tags, photodetectors, sensors, logic circuits, memory elements, capacitors, charge injection layers, Schottky diodes, planarising layers, antistatic films, conducting substrates or patterns, photoconductors, electrophotographic elements, organic light emitting transistors (OLET), organic spintronic devices, and an organic plasmon emitting devices (OPED).

Organic Plasmon emitting device (OPED) is preferably referred to as the device as reported by Koller et al., in Nature Photonics 2008, 2, 684-687. OPEDs are similar to OLEDs, except that at least one of anode and cathode should be capable to couple surface plasmons from the emissive layer. It is preferred that an OPED comprises one nano-diamondoid or a composition according to the present invention.

An electrophotographic element comprises a substrate, an electrode, and a charge transport layer above the electrode, and optionally a charge generation layer between electrode and the charge transport layer. For device details and variations and the materials used therein it is referred to the literature (Organic Photoreceptors for Xerography, Marcell Dekker, Inc., Ed. by Paul M. Borsenberger & D. S. Weiss (1998)). It is preferred that such a device comprises one nano-diamondoid or the mixture as described above and below, particularly preferably in the charge transport layer.

A preferred organic spintronic device is a spin-valve device, as reported by Z. H. Xiong et al., in Nature 2004 Vol 427 821, comprising two ferromagnetic electrodes and an organic layer between the two ferromagnetic electrodes, wherein at least one of the organic layers comprising a compound according the present invention and the ferromagnetic electrode is composed of Co, Ni, Fe, or alloys thereof, or $ReMnO_3$ or $CrO_2$, wherein Re is rare earth element.

Organic light emitting electrochemical cells (OLECs) comprise two electrodes, and a mixture or blends of electrolyte and fluorescent species in between, as firstly reported by Pei & Heeger in Science 1995, 269, 1086-1088. It is desired that nano-diamondoids or compositions according to the present invention are used in such a device.

Dye-sensitized solar cells (DSSCs) comprise an electrode/dye-sensitized $TiO_2$ porous thin film/electrolyte/counter electrode, as firstly reported by O'Regan & Grätzel in Nature 1991, 353, 737-740. The liquid electrolyte can be replaced by a solid hole transport layer, as published in Nature 1998, 395, 583-585.

Particularly preferred is an electronic device according to the present invention, characterized in that the device is an organic light emitting diode (OLED).

A typical sequence of layers as found in an OLED is, for example:
optionally a first substrate,
an anode layer,
optionally a hole injection layer (HIL),
optionally a hole transport layer (HTL) and/or an electron blocking layer (EBL),
optionally an active layer, which upon electrical or optical exciation, produces excitons,
optionally an electron transport layer (ETL) and/or a hole blocking layer (HBL),
optionally an electron injection layer (EIL),
optionally a layer comprising at least one nano-diamondoid and optionally with at least one organic functional material
a cathode layer,
optionally a second substrate.

The sequence of the given layer structure is exemplary. Other sequences are possible. Depending on the active layers in the above mentioned device, different opto-electronic devices will be obtained. In a first preferred embodiment, the active layer generates excitons upon electrical excitation through applying voltage between anode and cathode, and further emits light on radiative decay of the excitons. In general, this is called light emitting device. In another preferred embodiment, the active layer generates exciton through absorbing light, and further produces free charge carrier through exciton dissociation. In general, this is called photovoltaic or solar cell.

The term interlayer as used herein is defined as layer between the hole injection layer (or buffer layer) and the emissive layer in polymer light emitting diodes (PLEDs), being an electron blocking layer, as disclosed for example in WO 2004/084260 A2

FIG. 1 shows a preferred device structure for an OLED based on small molecules according to the present invention, where layer 1 is a thin film consisting of nano-diamondoids, preferably less than 20 nm in thickness, particularly preferably less than 10 nm, and very particularly preferably a monolayer of nano-diamondoid. The cathode electrode can be selected from Ba, Mg, Al, Au, Ag, ITO, particularly preferably Al and Au, or a combination thereof.

Figure 2:
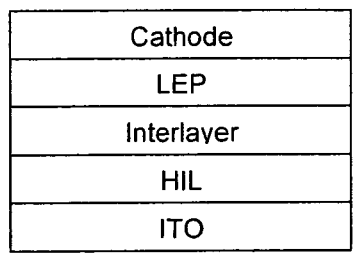

FIG. 2 shows a state-of-art device structure for an OLED based on polymers comprising cathode/LEP/Interlayer/HIL/anode.

Figure 3:
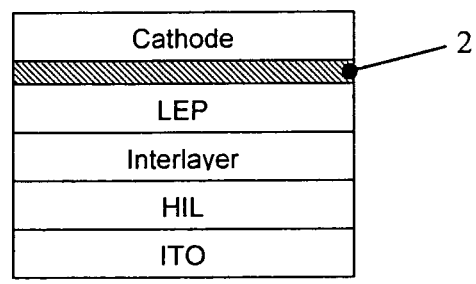

FIG. 3 shows a preferred device structure for an OLED based on polymers according to the present invention, where layer 2 is a thin film consisting of nano-diamondoids, e.g. tetramantan. Thickness of the layer 2 is preferably less than 20 nm, particularly preferably less than 10 nm, and very particularly preferably a monolayer of a nano-diamondoid. The cathode can be selected from Ba, Mg, Al, Au, Ag, ITO, preferably Al and Au, or a combination thereof.

Figure 4:
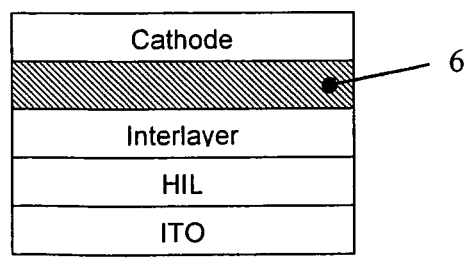

FIG. 4 shows a preferred device structure for an OLED according to the present invention, where layer 6 comprises a nano-diamondoid and an emissive organic material, which is either a small molecule or a polymer or a combination thereof. The cathode can be selected from Ba, Mg, Al, Au, Ag, and ITO, preferably form Al and Au, or a combination thereof.

Figure 5:
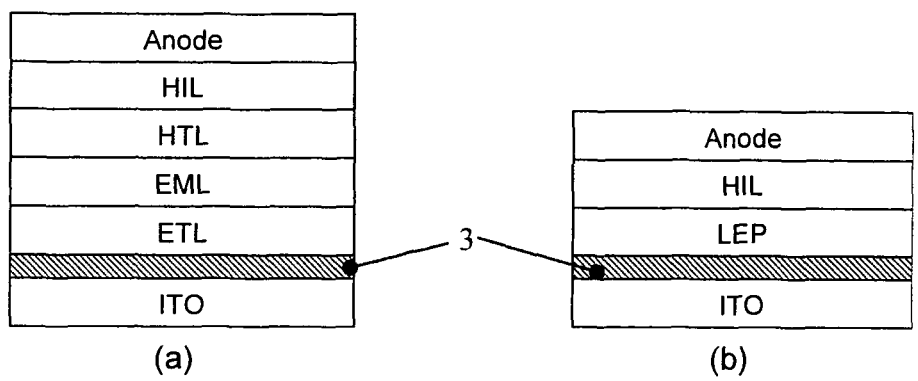

FIG. 5 shows a preferred new device structure for an OLED based on small molecules (a) and on polymers (b) according to the present invention, where layer 3 is a thin film comprising nano-diamondoids, preferably tetramantane and particularly preferably tetramantane functionalised with a group which serves as anchor on the anode. The thickness of layer 3 is preferably less than 20 nm, particularly preferably less than 10 nm. Particularly preferably the layer 3 is a monolayer comprising the nano-diamondoid. The anode may be selected from Au, Ag, Pt, Pd, and ITO, particularly preferably from Ag, Au, and ITO, or a combination thereof.

Figure 6:
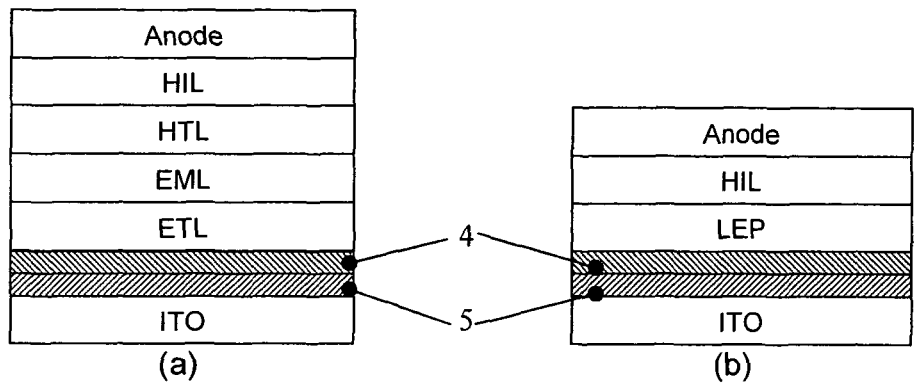

FIG. 6 shows a preferred new device structure for OLED based on small molecules (a) and on polymers (b), wherein layer 5 is a thin film of Au, preferably with a thickness of less than 5 nm, particularly preferably less than 2 nm. Layer 4 is a thin film comprising nano-diamondoids, preferably tetramantane, particularly preferably tetramantane functionalised with a group which serves as anchor on Au surface. This may be achieved, for example, by the introduction of thiol groups into the scaffold of nano-diamondoids, preferably into tetramantane. Very particularly preferably layer 4 is a monolayer of nano-diamondoids. The anode may be selected from a transparent metal oxide, for example ITO, IZO, $SnO_2$, or a composition based on conducting carbon nanotube, and/or graphene.

A large variety of further device structures are possible and a person skilled in the art can define device structures based on the disclosure of the present invention without being inventive.

The present invention also relates to a method for the preparation of an electronic device employing a formulation and/or a composition according to the present invention.

It is desirable to generate small structures or patterns in modern microelectronics to reduce costs for production and power consumption. Patterning of the layer of the invention may be carried out for example by photolithography, electron beam lithography, nano-imprint lithography (as reported for example in Science 1996, 272, 85-87), or "Dip-Pen" Nano-lithography (as reported in Science 1999, 283, 661-663).

For the use as thin layers in electronic or opto-electronic devices the nano-diamondoid, the compositions, and the formulations of the present invention can be deposited by any suitable method. For devices such as OLEDs liquid coating is more preferable as compared to vacuum deposition techniques. Methods for solution deposition are preferred.

Therefore, the present invention also relates to a method for the preparation of an electronic device, characterized in that at least one layer of the device is coated from solution.

Preferably the method for the preparation of the electronic device is a printing method.

Preferred printing methods of the present invention are selected from spin-coating, ink jet printing, screen printing, flexo printing, gravur printing, doctor blade printing, particularly preferred is ink jet printing.

Further preferred printing methods of the present invention are dip coating, letter-press printing, roller printing, reverse-roller printing, offset lithography printing, web printing, spray coating, brush coating or pad printing, and slot-die coating.

In order to be applied by ink jet printing or microdispensing, the nano-diamondoid or its composition or formulation according to this invention should be first dissolved in a suitable solvent. Solvents must fulfil the requirements stated above and must not have any detrimental effect on the chosen print head. Additionally, solvents should have boiling points greater than 100° C., preferably greater than 140° C. and particularly preferably greater than 150° C. in order to prevent operability problems caused by the solution drying out inside the print head. Apart from the solvents mentioned above, suitable solvents include substituted and non-substituted xylene derivatives, di-$C_{1-2}$-alkyl formamide, substituted and non-substituted anisoles and other phenol-ether derivatives, substituted heterocycles such as substituted pyridines, pyrazines, pyrimidines, pyrrolidinones, substituted and non-substituted N,N-di-$C_{1-2}$-alkylanilines and other fluorinated or chlorinated aromatics.

A preferred solvent for depositing nano-diamondoid, a composition, or formulation according to the present invention by ink jet printing comprises a benzene derivative which has a benzene ring substituted by one or more substituents wherein the total number of carbon atoms among the one or more substituents is at least three. For example, the benzene derivative may be substituted with at least a propyl group or at least three methyl groups. Such a solvent enables an ink jet fluid to be formed comprising the solvent with a polymer, which reduces or prevents clogging of the jets and separation of the components during spraying.

The solvent include at least one of the solvents selected from, but not limited to, dodecylbenzene, 1-methyl-4-tert-butylbenzene, terpineol limonene, isodurene, terpinolene, cymene, diethylbenzene. The solvent or combination of two or more solvents have a boiling point greater than 100° C., preferably greater than 140° C. Such solvent(s) also enhance film formation in the layer deposited and reduce defects in the layer.

The ink jet fluid is a composition of a solvent, binder, and nano-diamondoid, wherein, the nano-diamondoid can also be employed according to the compositions and formulations according to this invention and wherein the ink-jet fluid preferably has a viscosity at 20° C. of 1 to 100 mPas, particularly preferably 1 to 50 mPas, and very particularly preferably 1 to 30 mPas.

The nano-diamondoid or the compositions or formulations of the present invention can additionally comprise at least one further component. This further component is preferably selected from surface-active compounds, lubricating agents, wetting agents, dispersing agents, hydrophobing agents, adhesive agents, flow improvers, defoaming agents, deaerators, diluents which can be reactive or non-reactive, auxiliaries, colourants, dyes or pigments, sensitizers, stabilizers, or inhibitors.

The compositions of the present invention can also be deposited from vapour phase, particularly if the nano-diamondoid, a composition comprising the nano-diamondoid, or another compound of the composition has not the appropriate solubility or is not soluble in a desired solvent.

The present invention therefore also relates to a method for the preparation of an electronic device, characterized in that at least one functional layer is deposited through vapour phase deposition, and thermal vacuum phase deposition.

Different techniques for deposition may be applied in order to establish a device according to the present invention. The technique employed depends on, e.g., the material to be deposited. Thus, a vapour phase deposition of one layer may be followed by a deposition of another layer through spin coating, for instance.

The vapour phase deposition method can be selected from thermal vacuum evaporation, organic-vapour jet printing (OVJP) (Appl. Phys. Lett. (08), 92, 053301/1-053301/3), and any other standard technique known to the person skilled in the art.

It will be appreciated that variations to the foregoing embodiments of the invention can be made while still falling within the scope of the invention. Each feature disclosed in this specification, unless stated otherwise, may be replaced by alternative features serving the same, equivalent or similar purpose. Thus, unless stated otherwise, each feature disclosed is one example only of a generic series of equivalent or similar features.

All of the features disclosed in this specification may be combined in any combination, except combinations where at least some of such features and/or steps are mutually exclusive. In particular, the preferred features of the invention are applicable to all aspects of the invention and may be used in any combination. Likewise, features described in non-essential combinations may be used separately (not in combination).

It will be appreciated that many of the features described above, particularly of the preferred embodiments, are inventive in their own right and not just as part of an embodiment of the present invention. Independent protection may be sought for these features in addition to or alternative to any invention presently claimed.

The teaching as disclosed here can be abstracted and combined with other examples disclosed.

Other features of the invention will become apparent in the course of the following description of exemplary embodiments, which are given for illustration of the invention and are not intended to be limiting thereof.

WORKING EXAMPLES

Example 1

Polymeric Materials

The following polymers are synthesized by employing the Suzuki coupling. The reaction can be carried out according to synthetic methods well known to the person skilled in the art. The method is described, for example, in WO 2003/048225.

Polymer IL1, used as interlayer, is a copolymer comprising the following monomers with mol % as indicated:

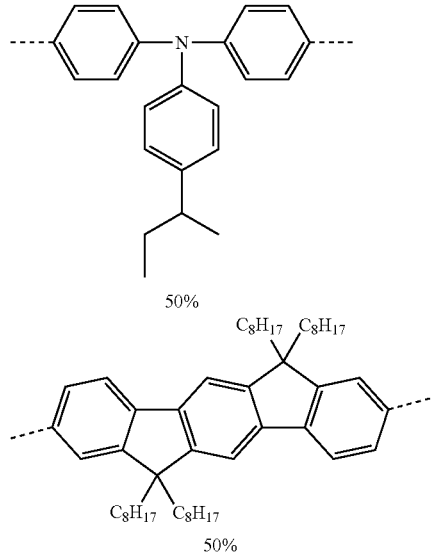

The molecular weight of the resulting polymer is distributed between 200000 to 300000 g/mol.

Polymer LEP1, used as light emitting polymer (LEP), is a copolymer comprising the following monomers with mol % as indicated.

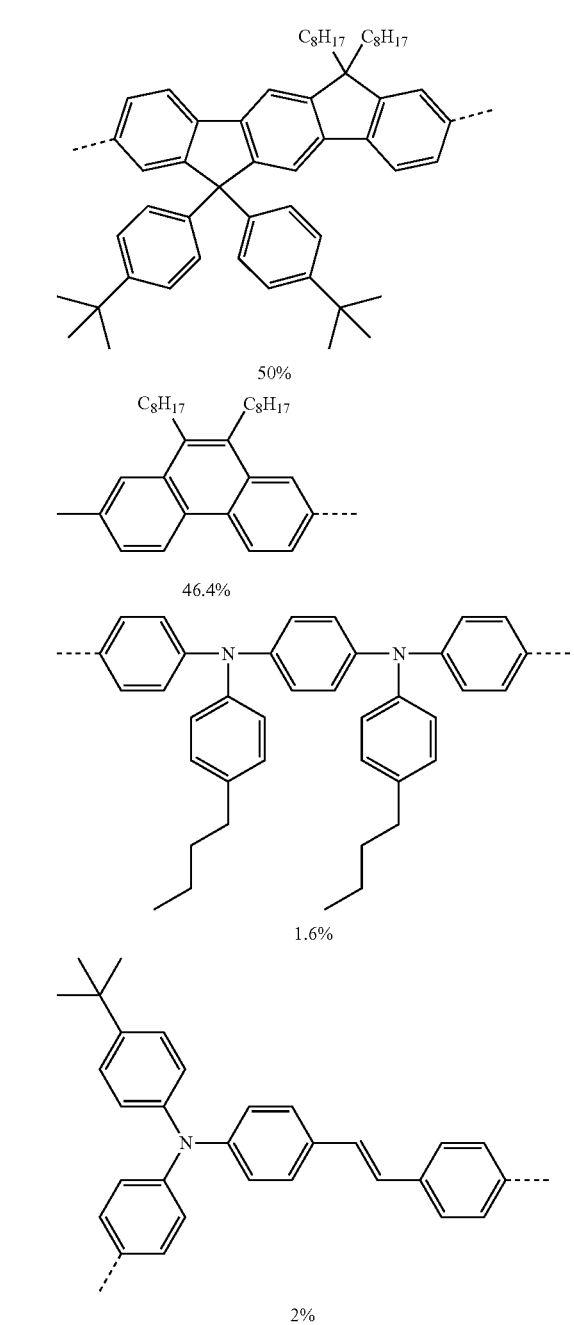

The molecular weight of the resulting polymer is distributed between 300000 to 400000 g/mol.

Example 2

Nano-Diamondoids

The following diamondoids: tetramantane and tetramantane-6S are used in the present invention:

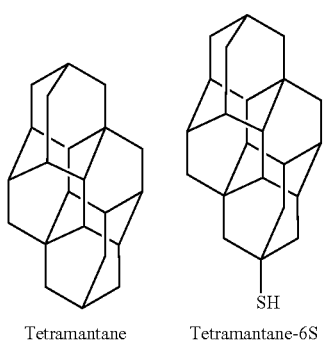

Tetramantane    Tetramantane-6S

The synthesis of tetramantane-6S is carried out according synthetic methods well known to the person skilled in the art. The synthetic route is, for example, reported in Organic Letters, 2006 Vol. 8, No. 9, 1767-1770.

Example 3

Formulation 1

Formulation 1 comprising LEP1 and tetramantane is prepared according to methods well known to the person skilled in the art as follows:
1) 80 mg LEP1 and 20 mg tetramantane are dissolved in 10 ml toluene;
2) the formulation is stirred until a clear solution is obtained;
3) the solution is filtered employing Millipore Millex LS, Hydrophobic PTFE 5.0 μm.

Formulation 1 can be used in order to build an emissive layer comprising the LEP or an ETL by coating. The procedures applied are standard techniques well known to the person skilled in the art.

Example 4

Composition 1

A solid powder composition 1 comprising LEP1 and tetramantane is obtained by evaporating the solvent of formulation 1. The resulting solid powder can be used in order to prepare further formulations. The procedures applied are standard techniques well known to the person skilled in the art.

Example 5

Formulation 2

Formulation 2 comprising LEP1 and tetramantane-6S is prepared according to methods well known to the person skilled in the art as follows:
1) 80 mg LEP1 and 20 mg tetramantane-6S are dissolved in 10 ml toluene;
2) the formulation is stirred until a clear solution is obtained;
3) the solution is filtered employing Millipore Millex LS, Hydrophobic PTFE 5.0 μm.

Formulation 2 can be used in order to build an emissive layer comprising the LEP or an ETL by coating. The procedures applied are standard techniques well known to the person skilled in the art.

Example 6

Composition 2

A solid powder composition 2 comprising LEP1 and tetramantane-6S is obtained by evaporating the solvent of formulation 2. The resulting solid powder is used in order to prepare further formulations. The procedures applied are standard techniques well known to the person skilled in the art.

Example 7

Formulation 3

Formulation 3 comprising LEP1 and tetramantane-6S is prepared according to methods well known to the person skilled in the art as follows:
1) 40 mg IL1 and 10 mg tetramantane-6S are dissolved in 10 ml toluene;
2) the formulation is stirred until a clear solution is obtained;
3) the solution is filtered employing Millipore Millex LS, Hydrophobic PTFE 5.0 μm.

Formulation 3 can be used in order to build an interlayer by coating. The procedures applied are standard techniques well known to the person skilled in the art.

Example 8

Composition 3

A solid powder composition 3 comprising IL1 and tetramantane-6S is obtained by evaporating the solvent of formulation 3. The resulting solid powder is used in order to prepare further formulations. The procedures applied are standard techniques well known to the person skilled in the art.

Example 9

PLED 1 Control Device

A PLED1 as depicted in FIG. 2 is prepared according to the following procedure employing standard methods well known to the person skilled in the art:
1) PEDOT (Baytron P A14083) is deposited with a thickness of 80 nm onto an ITO-coated glass substrate by spin coating and then heated for 10 min. at 180° C.;
2) 20 nm IL1 is deposited by spin coating from a toluene solution having a concentration of 0.5 wt % in a glovebox;
3) the IL1 layer is heated at 180° C. for 1 hour in the glovebox;
4) a LEP layer is deposited by spin-coating a formulation comprising LEP1 in toluene with a concentration of 0.5-1 wt % yielding a layer with a thickness of 65 nm;
5) the device is heated at 180° C. for 10 minutes;
6) a Ba/Al cathode is deposited by evaporation onto the emissive layer with a thickness of 3 nm/150 nm;
7) the device is encapsulated.

Example 10

PLED2 Device

A PLED2 as depicted in FIG. 3 is prepared according to the following procedure employing standard methods well known to the person skilled in the art:

1)-4) procedure as described in Example 9;
5) an EIL is deposited by spin-coating from a solution of tetramantane-6S in pentane with a concentration of 0.5 wt %. Thickness of the layer is 10 nm;
6) the device is heated at 180° C. for 10 minutes;
7) a Ba/Al (3 nm/150 nm) cathode is deposited by evaporation onto the EIL;
8) the device is encapsulated.

Example 11

PLED3 Device

A PLED3 as depicted in FIG. 4 comprising tetramantane is prepared according to the following procedure employing standard methods well known to the person skilled in the art:
1)-3) procedure as described in Example 9.
4) formulation 1 is deposited by spin-coating. The thickness of the layer is 65 nm.
5)-7) procedure as described in Example 9.

Example 12

PLED4 Device

A PLED4 as depicted in FIG. 4 comprising tetramantane-6S is prepared according to the following procedure employing standard methods well known to the person skilled in the art:
1)-3) procedure as described in Example 9;
4) formulation 2 is deposited by spin-coating. The thickness of the layer is 65 nm;
5)-7) procedure as described in Example 9.

Example 13

PLED5 Device

A PLED5 as depicted in FIG. 6(b) comprising tetramantane-6S and a Au cathode is prepared according to the following procedure employing standard methods well known to the person skilled in the art:
1) 3-5 nm Au is deposited onto an ITO-coated glass substrate by vacuum thermal evaporation;
2) a self-assembled monolayer (SAM) of tetramantane-6S on Au is established by immersing the Au-coated ITO substrate into the solution of tetramantane-6S in ethanol/toluene (1:1) with a concentration of 1 wt % for two days. The substrate is then washed with toluene and ethanol. The solvent is removed by heating (Science 2007, 316, 1460-1462);
3) the LEP layer is deposited by spin-coating a formulation comprising LEP1 in toluene with a concentration of 0.5-1 wt %. The thickness of the layer is 65 nm;
4) NPB (20 nm) is deposited as HIL onto the LEP layer by vacuum thermal evaporation;
5) a cathode Au/Al (3 nm/150 nm) is deposited by evaporation onto the emissive layer;
6) the device is encapsulated.

Example 14

PLED6 Control Device 2

PLED6 is prepared as a control device for PLED5. PLED6 has almost the same device structure as PLED 5 (see FIG. 6(b)). In contrast to PLED5, PLED6 has no SAM comprising tetramantane-6S.

PLED6 is prepared according to the procedure as outlined in Example 13, but without performing step 2.

Example 15

Measurements on PLED 1-6

The devices PLED1-6 are investigated with respect to various physical properties employing standard methods well known to the person skilled in the art. The properties recorded are: voltage-current-luminescence (VIL) characteristics, the electroluminescence (EL) spectrum, color coordinates (CIE), efficiency, and driving voltages.

The comparison using PLED1 as control is summarized in the Table 1, wherein Uon represents the turn-on voltage, U(100) is the voltage at 100 nits, and U(1000) is the voltage at 1000 nits. The external quantum efficiency is abbreviated as EQE.

TABLE 1

Performance comparison PLED1-5

| | Max. Eff. [cd/A] | Uon [V] | U(100) [V] | U(1000) [V] | CIE @ 100 cd/m² | EQE @ Max. Eff |
|---|---|---|---|---|---|---|
| PLED1 | 6.71 | 3.6 | 6.1 | 7.7 | (0.14, 0.19) | 4.64% |
| PLED2 | 7.37 | 3.3 | 5.1 | 6.8 | (0.15, 0.21) | 5.32% |
| PLED3 | 6.90 | 3.6 | 6.0 | 8.1 | (0.14, 0.20) | 4.69% |
| PLED4 | 7.39 | 3.3 | 5.2 | 7 | (0.15, 0.19) | 5.11% |

The data in Table 1 indicate that incorporating a nano-diamondoid in OLEDs, improves the performance of OLEDs significantly. The best performance is achieved by using tetramantane-6S as EIL (PLED2), followed by a mixed LEP layer comprising tetramantane-6S (PLED4). The OLED comprising mixture of pure tetramantane and PLED1 gives a comparable or slightly better performance as compared to the control device PLED1.

PLED5 shows a new device architecture with advantageous properties as compared to prior art architectures. Table 2 shows the comparison between PLED5 and PLED6, having very similar device structures except for the SAM. PLED6 works like a hole only device. No light is emitted and one cannot take an electroluminescence spectrum. In contrast PLED5 having Au/SAM as cathode works with a good performance.

TABLE 2

Comparison between PLED5 and PLED6

| | | | | | | |
|---|---|---|---|---|---|---|
| PLED5 | 6.06 | 3.7 | 6.0 | 7.9 | (0.14, 0.19) | 4.19% |
| PLED6 | 0.00 | 8.7 | — | — | — | 0.00% |

Example 16

SMOLED Device 1 and 2

In the following, further OLEDs based on small molecules (SMOLEDs) are prepared and compared.

The functional small molecule materials employed here are listed as follows: HTM1 is used in HTL, ETM1 in ETL, and the EML consists of a mixture of Host1 and Emitter1 in a volume ratio of 95:5 for both SMOLEDs. The synthesis of Emitter1 is disclosed in WO 2008/006449 A1.

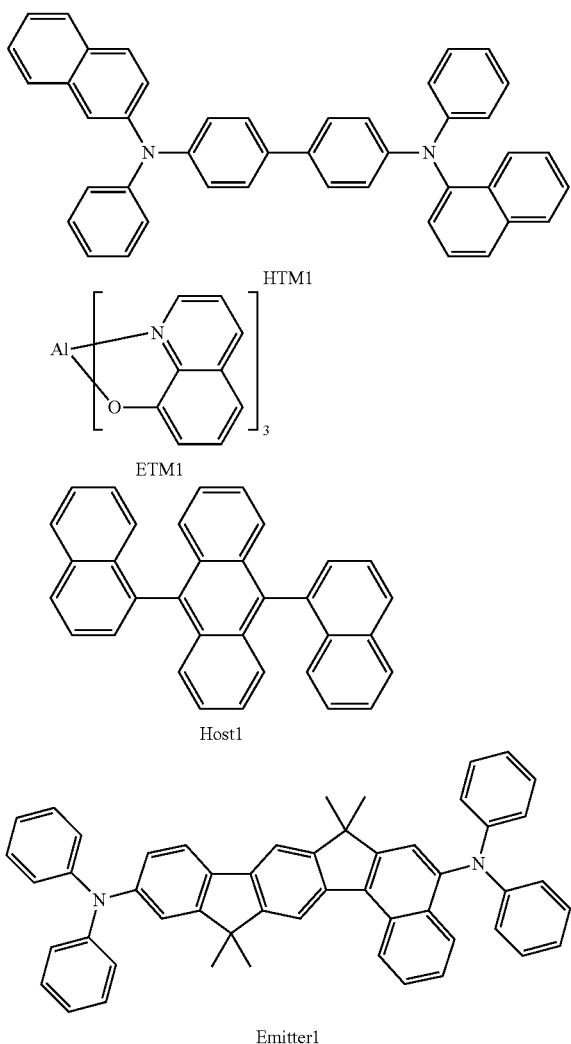

HTM1

ETM1

Host1

Emitter1

The preparation of SMOLEDs is performed according to the procedure as disclosed in WO 2004/058911 or WO 2008/006449. Except for the PEDOT layer, all other organic layers are deposited by vacuum thermal evaporation. The SMOLEDs are prepared as follows:

SMOLED1 is an OLED according to a preferred device structure of the present invention as shown in FIG. 5a, but omitting HIL. The layer structure of SMOLED1 is ITO/Au (3 nm)/SAM/ETM1 (20 nm)/Host1:5% Emitter1 (30 nm)/HTM 1 (60 nm)/Au (150 nm), wherein SAM is a self-assembly monolayer of tetramantane-6S. The stack ITO/Au (3 nm)/SAM/ is used as cathode, and is prepared according to the same procedure as outlined for PLED5 in example 13.

SMOLED2 has the same architecture as SMOLED1 but without a SAM between the layers comprising Au and ETL. The structure of SMOLED2 is: ITO/Au (3 nm)/ETM1 (20 nm)/Host1:5% Emitter1 (30 nm)/HTM1 (60 nm)/Au (150 nm).

SMOLED1 and SMOLED2 are analyzed and their performance characteristics are compiled in Table 3. Like PLEP6, SMOLED1 does not emit light, as no electron can be injected from ITO/Au.

The performance of SMOLED1 is significantly improved as compared to SMOLED2.

TABLE 3

Performance comparison of SMOLED1 and SMOLED2

| | Max. Eff. [cd/A] | Uon [V] | U(100) [V] | U(1000) [V] | CIE @ 100 cd/m$^2$ | EQE @ Max. Eff. |
|---|---|---|---|---|---|---|
| SMOLED1 | 4.80 | 3.4 | 5.7 | 7.0 | (0.16, 0.18) | 3.41% |
| SMOLED2 | 0.00 | 8.0 | — | — | — | 0.00% |

The invention claimed is:

1. A composition comprising at least one nano-diamondoid and at least one organic functional material.

2. The composition of claim 1, wherein at least one nano-diamondoid is hydrogen-terminated or functionalized.

3. The composition of claim 1, wherein at least one nano-diamondoid is selected from adamantane, diamantane, triamantane, tetramantane, pentamantane, cyclohexamantane, decamantane, higher diamondoids, isomers and derivatives thereof.

4. The composition of claim 1, wherein at least one organic functional material is selected from host materials, emissive materials (EM), hole injection materials (HIM), hole transport materials (HTM), hole blocking materials (HBM), electron injection materials (EIM), electron transport materials (ETM), electron blocking materials (EBM), exciton blocking materials (ExBM), photoabsorption materials, dyes, and metal complexes.

5. The composition of claim 1, wherein at least one organic functional material is an emissive material.

6. The composition of claim 5, wherein the emissive material comprises at least one host material and at least one emitter material, wherein the host material is selected from anthracenes, benzanthracenes, ketones, carbazoles, triarylamines, indenofluorenes, fluorenes, spirobifluorenes, phenanthrenes, dihydrophenanthrenes, thiophenes, triazines, isomers and derivatives thereof.

7. The composition of claim 1, wherein at least one organic functional material is a electron injection material, which is selected from metal complexes of 8-hydroxyquinoline, heterocyclic organic compounds, fluorenones, fluorenylidene methane, perylenetetracarboxylic acid, anthraquinone dimethanes, diphenoquinones, anthrones and anthraquino-nediethylene-diamines, isomers and derivates thereof.

8. The composition of claim 1, wherein at least one organic functional material is an electron transport material, which is selected from imidazoles, pyridines, pyrimidines, pyridazines, pyrazines, oxadiazoles, chinolines, chinoxalines, anthracenes, benzanthracenes, pyrenes, perylenes, benzimidazoles, triazines, ketones, phosphinoxides, phenazines, phenanthrolines, triarylboranes, isomers and derivatives thereof.

9. The composition of claim 1, wherein at least one organic functional material is a dye, which is selected from perylenes, ruthenium dyes, phthalocyanines, azo dyes, perylene-diimides, porphyrines, squaraines, isomers and derivatives thereof.

10. The composition of claim 1, wherein at least one organic functional material is a metal complex, wherein the metal is selected from transition metals, rare earth elements, lanthanides and actinides, preferably the metal is selected from Ir, Ru, Os, Eu, Au, Pt, Cu, Zn, Mo, W, Rh, Pd, and Ag.

11. A formulation comprising the composition of claim 1 and at least one organic solvent.

12. An electronic or opto-electronic device comprising the composition of claim 1.

13. An electronic or opto-electronic device comprising the formulation of claim 11.

14. An electronic device comprising at least one organic layer and at least two electrodes, wherein at least one of the organic layers comprises at least one hydrogen-terminated or functionalized nano-diamondoid.

15. The electronic device of claim 14, wherein at least one organic layer consists of at least one hydrogen-terminated or functionalized nano-diamondoid, preferably a functionalized nano-diamondoid.

16. The electronic device of claim 15, wherein the at least one layer is a monolayer.

17. The electronic device of claim 14, wherein at least one of the organic layers comprises at least one composition comprising at least one nano-diamondoid and at least one organic functional material.

18. The electronic device of claim 14, wherein at least one nano-diamondoid is mixed into at least one electron injection layer.

19. The electronic device of claim 14, wherein the organic layer comprising at least one nano-diamondoid is adjacent to at least one electrode.

20. The electronic device of claim 14, wherein the device is a light emitting, light converting, light harvesting, or light sensor device selected from organic light emitting diodes, polymer light emitting diodes, organic light emitting electrochemical cells, organic field effect transistors, thin film transistors, organic solar cells, organic laser diodes, organic integrated circuits, radio frequency identification tags, photodetector, sensors, logic circuits, memory elements, capacitor, charge injection layers, Schottky diodes, planarising layers, antistatic films, conducting substrates or patterns, photoconductors, electrophotographic elements, organic light emitting transistors, organic spintronic devices, and an organic plasmon emitting devices, preferably selected from organic light emitting diodes.

21. The method for preparing the electronic device of claim 14 comprising employing the formulation of at least one nano-diamondoid, at least one organic functional material, and at least one organic solvent.

22. The method for preparing the electronic device of claim 14 comprising employing the composition of at least one nano-diamondoid and at least one organic functional material.

23. The method of claim 20, wherein at least one layer of the device is coated from solution.

24. The method of claim 20, wherein the method employed is a printing method.

25. The method of claim 20, wherein at least one functional layer is deposited through vapour phase deposition, and thermal vacuum phase deposition.

* * * * *